US012777770B2

(12) United States Patent
Shiomi et al.

(10) Patent No.: US 12,777,770 B2
(45) Date of Patent: Oct. 27, 2026

(54) SOLID-STATE IMAGING ELEMENT INCLUDING NANOPARTICLES

(71) Applicants: SONY GROUP CORPORATION, Tokyo (JP); SONY SEMICONDUCTOR SOLUTIONS CORPORATION, Kanagawa (JP)

(72) Inventors: Michinori Shiomi, Tokyo (JP); Syuuiti Takizawa, Tokyo (JP); Yuta Okabe, Kanagawa (JP); Osamu Enoki, Kanagawa (JP); Yosuke Saito, Kanagawa (JP)

(73) Assignees: SONY GROUP CORPORATION, Tokyo (JP); SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 384 days.

(21) Appl. No.: 18/289,172

(22) PCT Filed: Apr. 27, 2022

(86) PCT No.: PCT/JP2022/019141

§ 371 (c)(1),
(2) Date: Nov. 1, 2023

(87) PCT Pub. No.: WO2022/234806

PCT Pub. Date: Nov. 10, 2022

(65) Prior Publication Data

US 2024/0237373 A1 Jul. 11, 2024

(30) Foreign Application Priority Data

May 7, 2021 (JP) ................................. 2021-079316

(51) Int. Cl.
*H10F 30/20* (2025.01)
*H04N 25/70* (2023.01)
(Continued)

(52) U.S. Cl.
CPC .................................... *H10K 39/32* (2023.02)

(58) Field of Classification Search
CPC ......... H10K 39/32; H10F 30/20; H10F 39/12; H10F 77/10; H04N 25/70
See application file for complete search history.

(56) References Cited

U.S. PATENT DOCUMENTS 5,095,479 A * 3/1992 Harigaya ............... G11B 7/243 430/270.13
2013/0125982 A1* 5/2013 Oguri .................... H10F 77/126 136/258

(Continued)

FOREIGN PATENT DOCUMENTS

CN 104969360 A * 10/2015 ........... H10D 62/129
CN 110176508 A * 8/2019 ............. H10F 71/00

(Continued)

OTHER PUBLICATIONS

International Search Report from corresponding PCT application PCT/JP2022/019141, dated Jul. 19, 2022.

*Primary Examiner* — Sue A Purvis
*Assistant Examiner* — Jaime Lynn Sprenger
(74) *Attorney, Agent, or Firm* — K&L Gates LLP

(57) ABSTRACT

A solid-state imaging element according to an embodiment of the present disclosure includes: a photoelectric conversion layer including first semiconductor nanoparticles; and a buffer layer including second semiconductor nanoparticles. A p-n junction surface is formed at an interface between the photoelectric conversion layer and the buffer layer. A product of a carrier concentration and a film thickness of the buffer layer is larger than a product of a carrier concentration of the photoelectric conversion layer and a diffusion length of a minority carrier, and a thickness of a depletion region formed in the photoelectric conversion layer is maximized.

26 Claims, 16 Drawing Sheets

(51) Int. Cl.

| | |
|---|---|
| ***H10F 39/12*** | (2025.01) |
| ***H10F 77/10*** | (2025.01) |
| ***H10K 39/32*** | (2023.01) |

(56) References Cited

U.S. PATENT DOCUMENTS

| | | | | |
|---|---|---|---|---|
| 2016/0293783 | A1 | 10/2016 | Shiomi et al. | |
| 2019/0386064 | A1 | 12/2019 | Valouch et al. | |
| 2021/0057168 | A1 | 2/2021 | Shiomi et al. | |
| 2021/0312156 | A1 | 10/2021 | Ferrara et al. | |
| 2021/0313531 | A1* | 10/2021 | Yamaguchi | H10K 30/10 |

FOREIGN PATENT DOCUMENTS

| | | | | | |
|---|---|---|---|---|---|
| CN | 110687694 | A | * | 1/2020 | G02F 1/025 |
| CN | 110692141 | A | * | 1/2020 | H10K 85/50 |
| CN | 112694263 | A | * | 4/2021 | C03C 17/3411 |
| DE | 3136141 | C2 | * | 5/1988 | H10F 30/15 |
| JP | 2008047580 | A | * | 2/2008 | |
| JP | 2015128105 | A | | 7/2015 | |
| JP | 2020021850 | A | | 2/2020 | |
| JP | 2020507919 | A | | 3/2020 | |
| TW | 201513330 | A | * | 4/2015 | H10K 30/353 |
| WO | 2019150989 | A1 | | 8/2019 | |
| WO | WO-2021002070 | A1 | * | 1/2021 | H10F 39/107 |

* cited by examiner

[ FIG. 1 ]
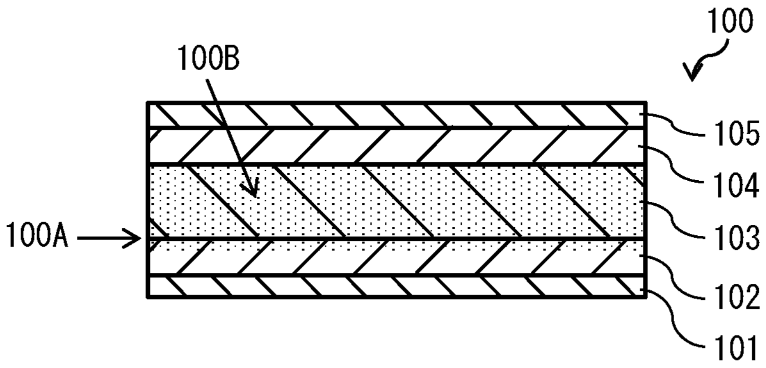
[ FIG. 2 ]
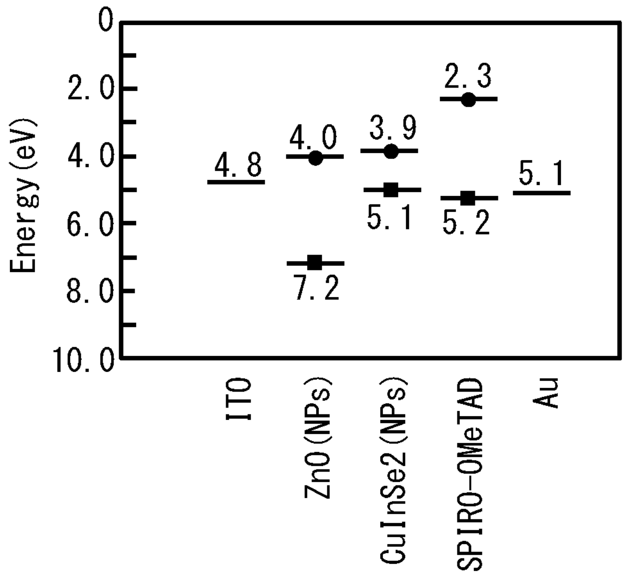

[ FIG. 3 ]
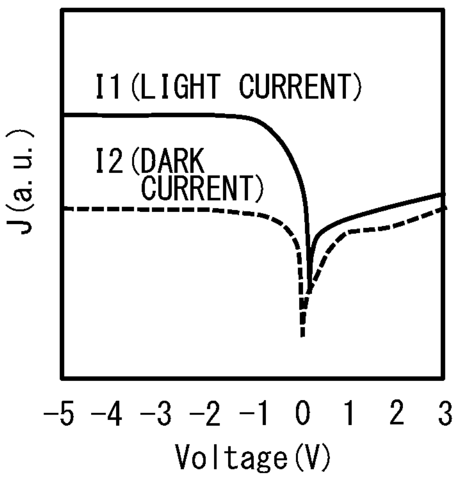
[ FIG. 4 ]
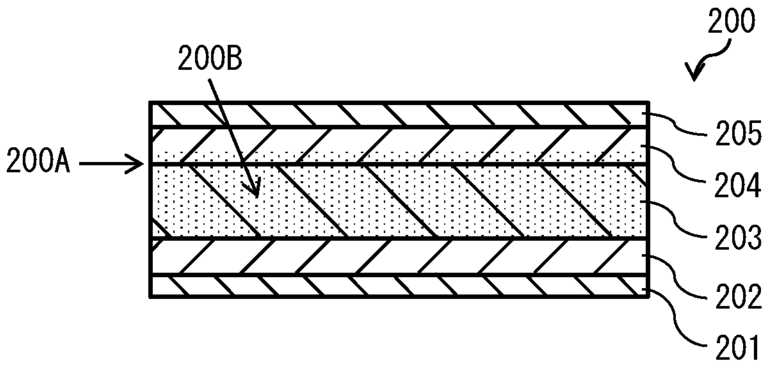

[ FIG. 5 ]
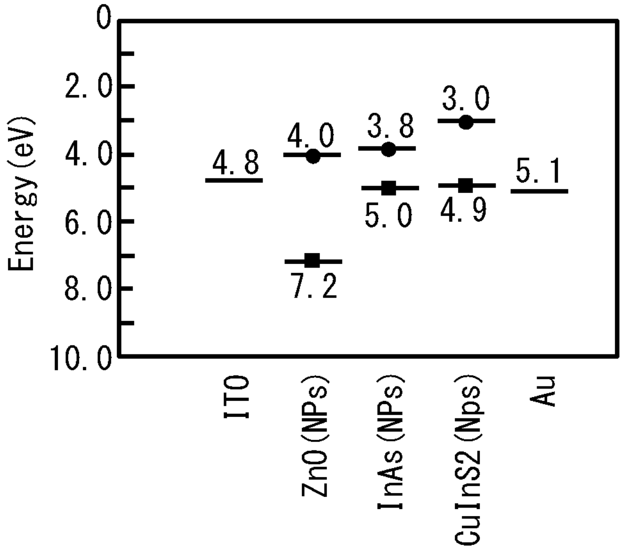
[ FIG. 6 ]
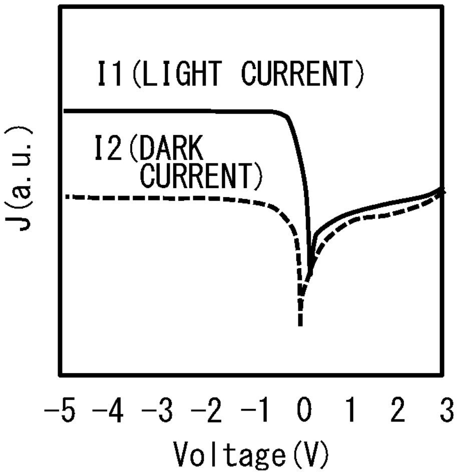

[ FIG. 7 ]
| | EXAMPLE 1 | EXAMPLE 2 | EXAMPLE 3 | COMPARATIVE EXAMPLE 1 | COMPARATIVE EXAMPLE 2 | COMPARATIVE EXAMPLE 3 |
|---|---|---|---|---|---|---|
| 205 | Au | Au | Au | Au | Au | Au |
| 204 | $CuInSe_2$ | Pbs-EDT | MoOx | NONE | SPIRO-OMeTAD | P3HT |
| 203 | InAs | InAs | InAs | InAs | InAs | InAs |
| 202 | ZnO | ZnO | ZnO | ZnO | ZnO | ZnO |
| 201 | ITO | ITO | ITO | ITO | ITO | ITO |
[ FIG. 8 ]
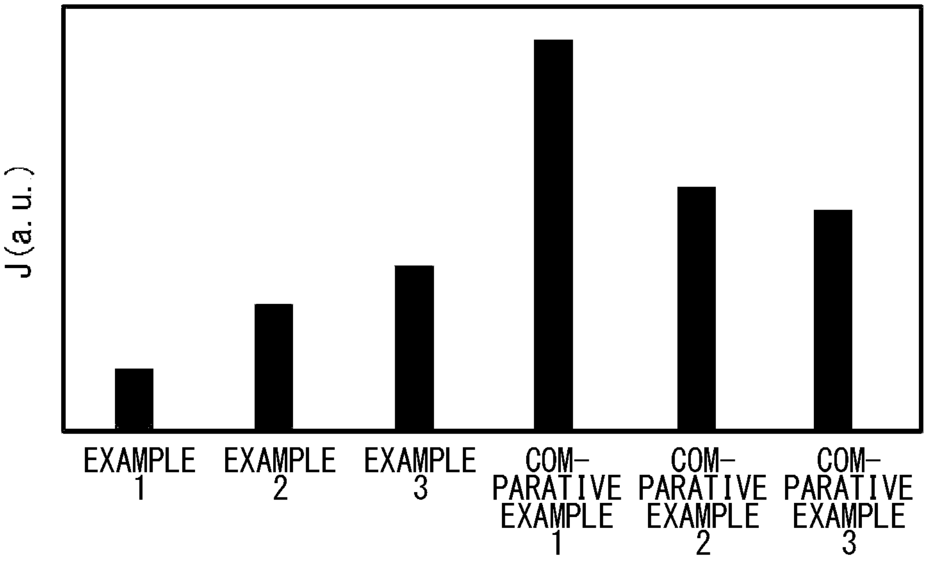

[ FIG. 9 ]
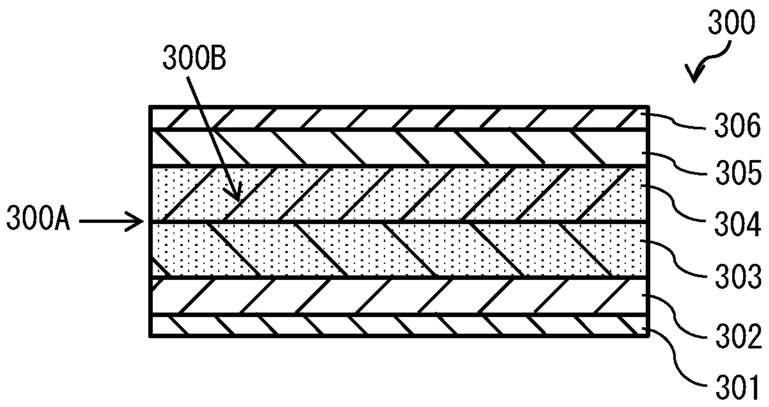
[ FIG. 10 ]
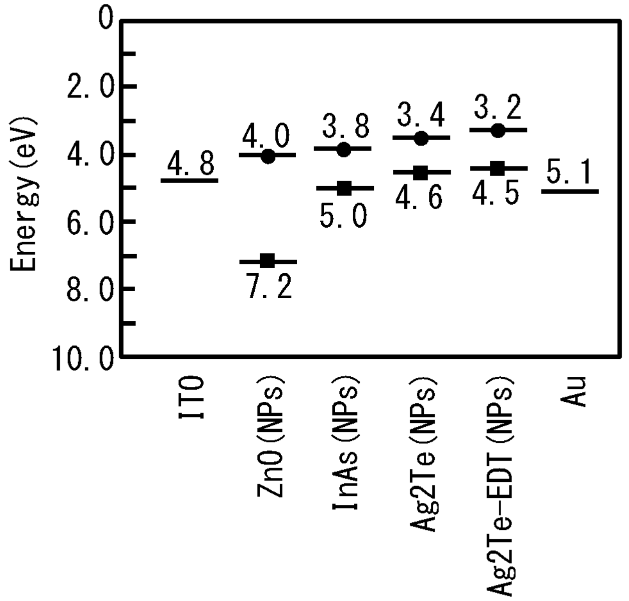

[ FIG. 11 ]
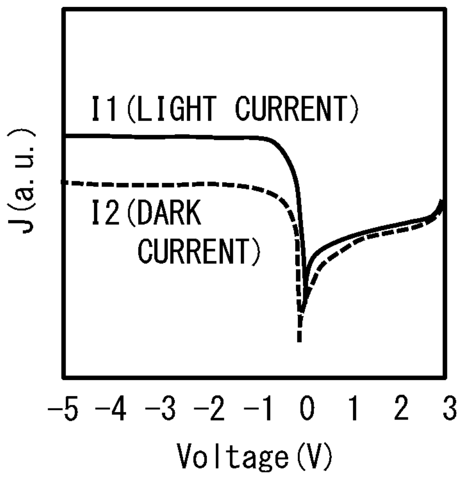

[ FIG. 12 ]
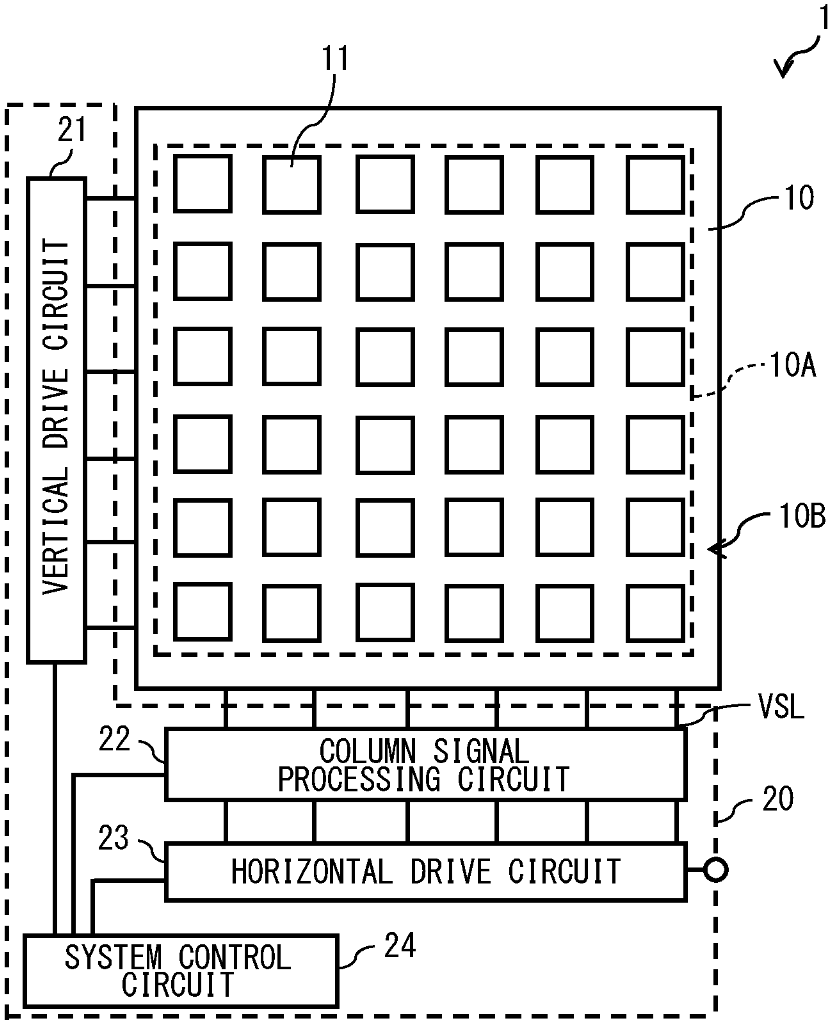

[ FIG. 13 ]
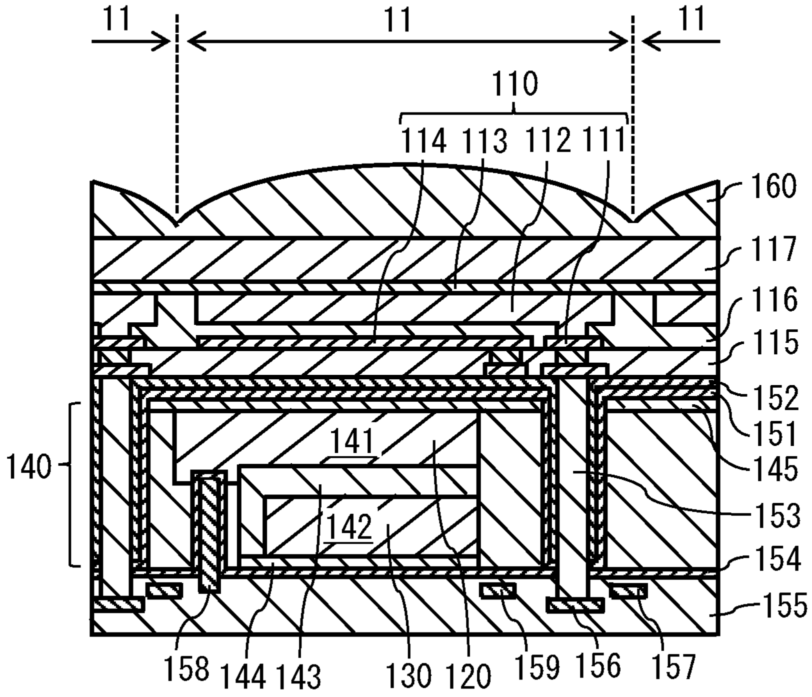

[ FIG. 14 ]
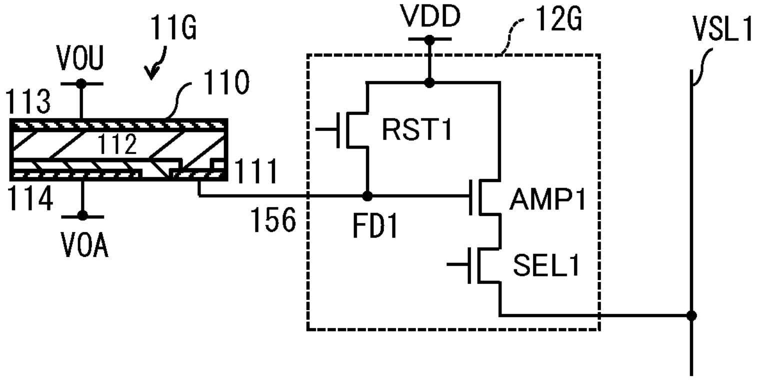
[ FIG. 15 ]
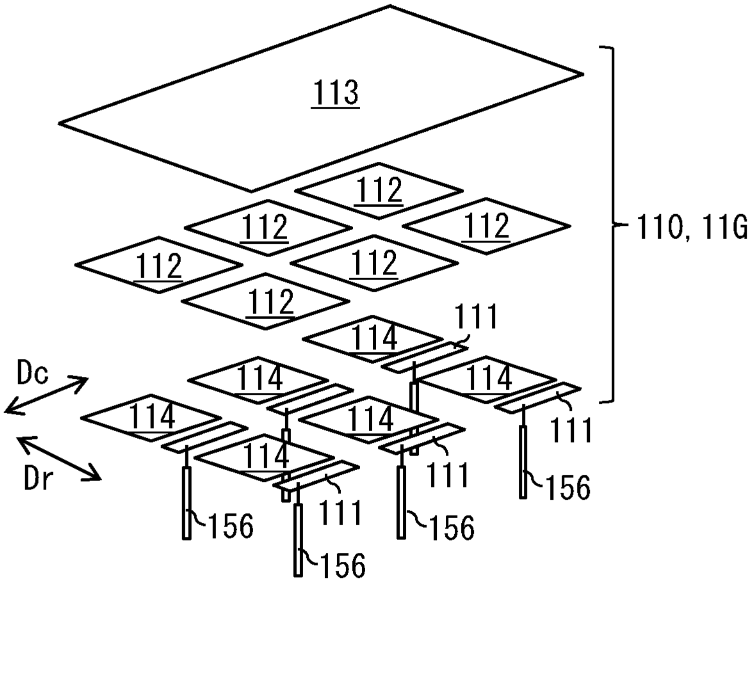

[ FIG. 16 ]
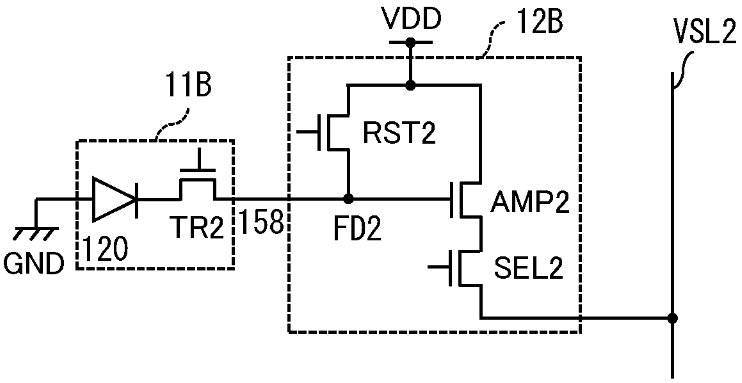
[ FIG. 17 ]
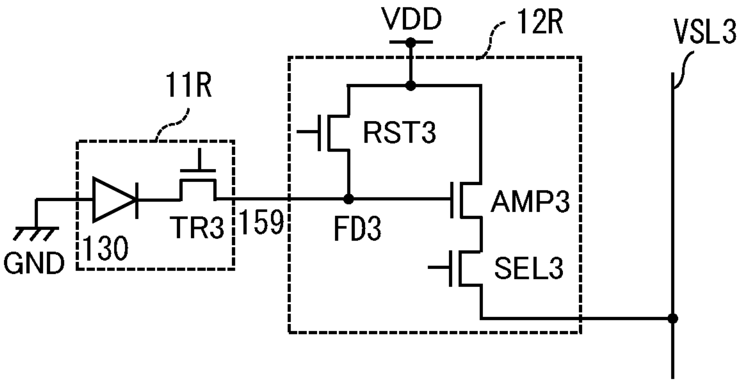

[ FIG. 18 ]
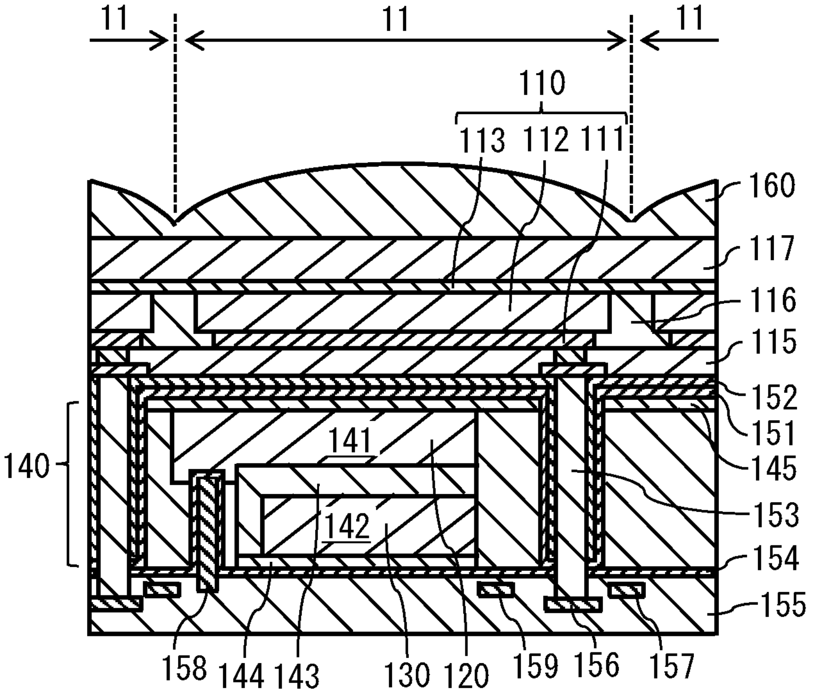

[ FIG. 19 ]
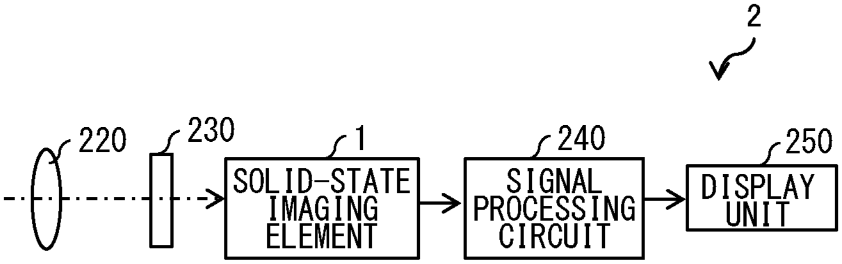

[ FIG. 20 ]
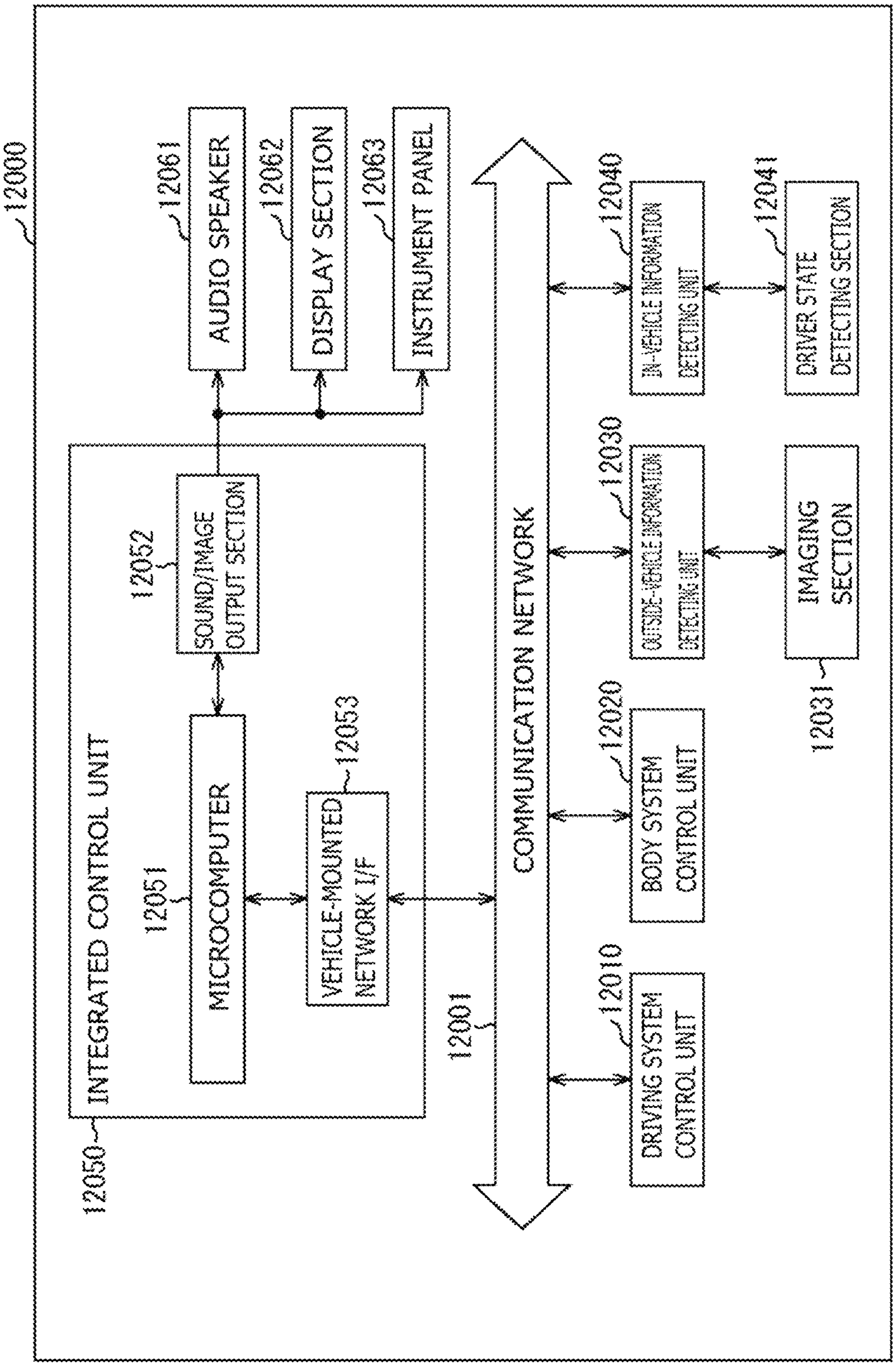

[ FIG. 21 ]
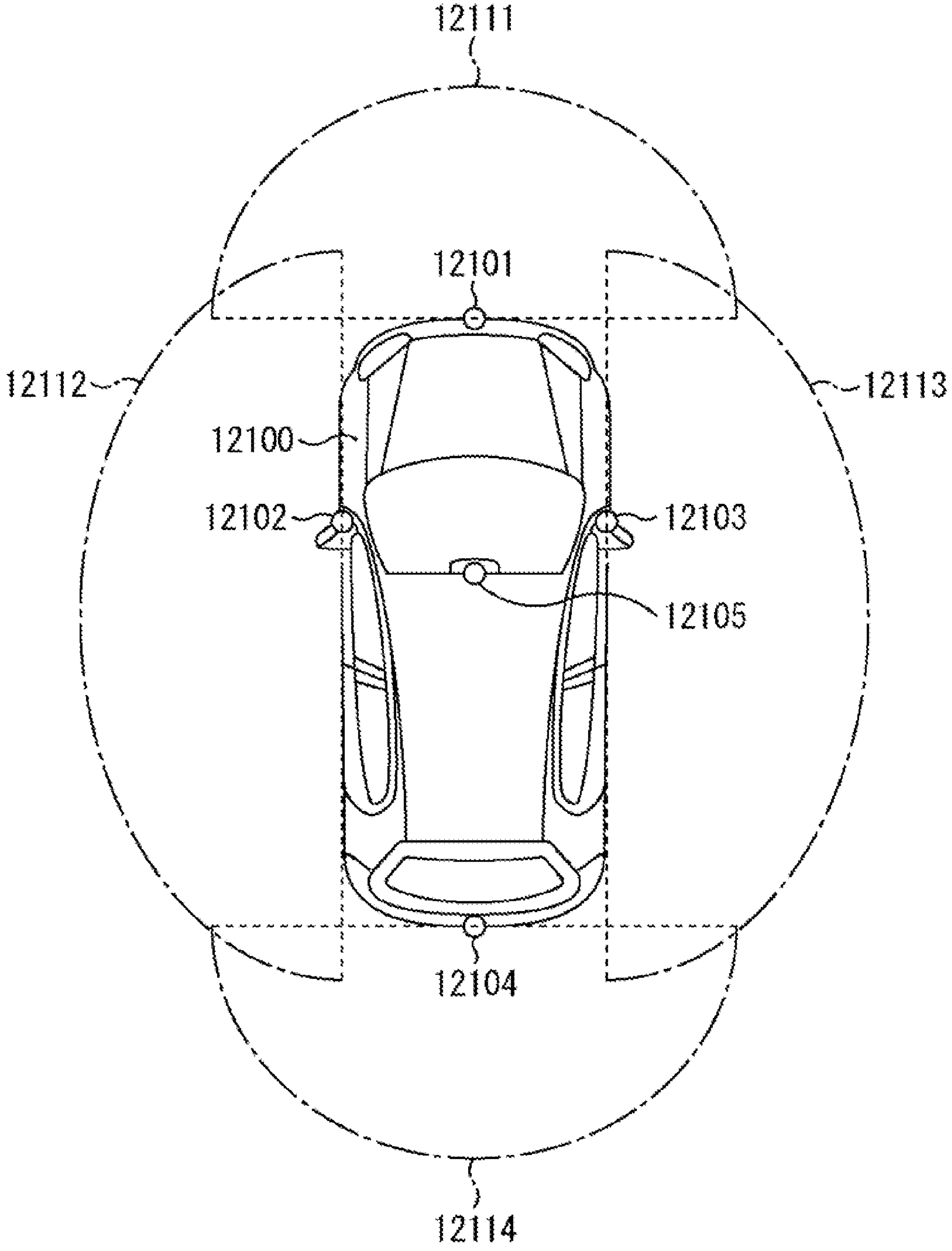

[ FIG. 22 ]
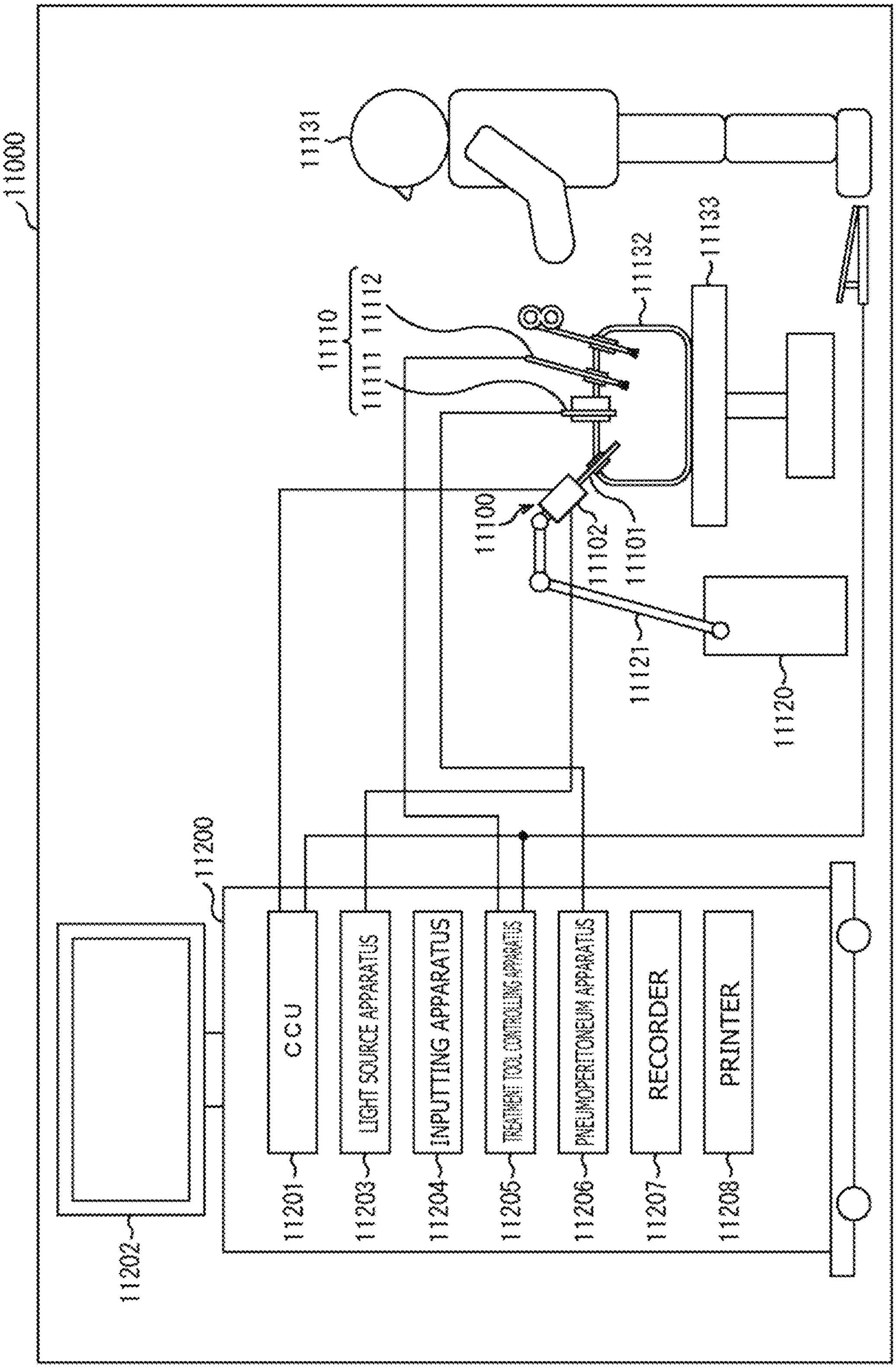

[ FIG. 23 ]
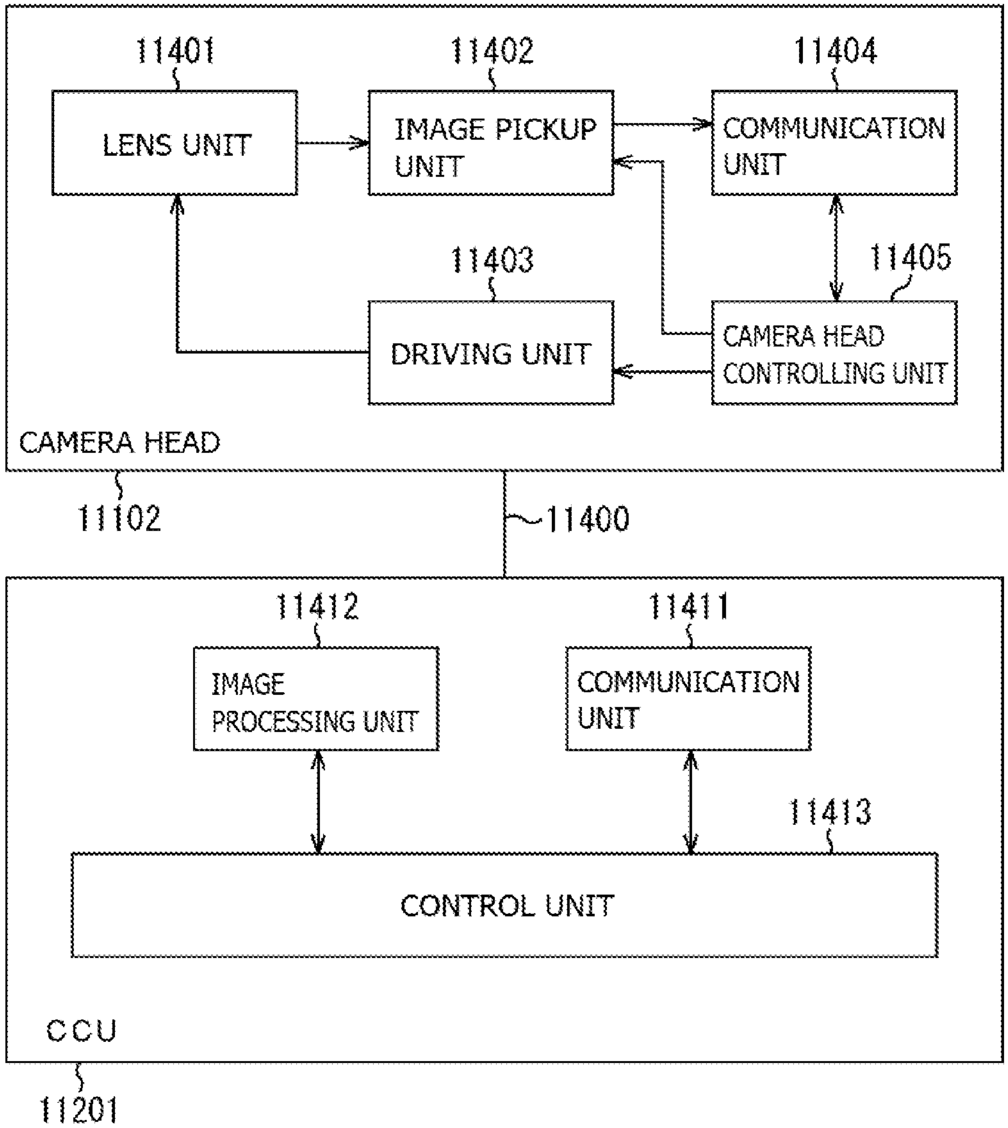

SOLID-STATE IMAGING ELEMENT INCLUDING NANOPARTICLES

TECHNICAL FIELD

The present disclosure relates to a solid-state imaging element.

BACKGROUND ART

A photoelectric conversion element using a semiconductor material with wavelength selectivity is able to photoelectrically convert light of a particular wavelength range. In a case where such a photoelectric conversion element is used as a solid-state imaging element, a stacked-type photoelectric conversion element in which a plurality of photoelectric conversion elements with different wavelength selectivities are stacked can be provided for each pixel. It is to be noted that PTL 1, for example, discloses the use of semiconductor nanoparticles of lead sulfide (PbS) as the semiconductor material described above.

CITATION LIST

Patent Literature

PTL 1: International Publication No. WO2019/150989

SUMMARY OF THE INVENTION

Incidentally, in the field of a solid-state imaging element as described above, it is not easy to reduce a dark current in a case where semiconductor nanoparticles are used as a semiconductor material as described above. It is therefore desirable to provide a solid-state imaging element that makes it possible to reduce a dark current.

A solid-state imaging element according to a first aspect of the present disclosure includes: a photoelectric conversion layer including first semiconductor nanoparticles; and a buffer layer including second semiconductor nanoparticles. A p-n junction surface is formed at an interface between the photoelectric conversion layer and the buffer layer. A product of a carrier concentration and a film thickness of the buffer layer is larger than a product of a carrier concentration of the photoelectric conversion layer and a diffusion length of a minority carrier, and a thickness of a depletion region formed in the photoelectric conversion layer is maximized.

A solid-state imaging element according to a second aspect of the present disclosure includes: a p-type photoelectric conversion layer including first semiconductor nanoparticles; and an n-type photoelectric conversion layer including second semiconductor nanoparticles. A p-n junction surface is formed at an interface between the p-type photoelectric conversion layer and the n-type photoelectric conversion layer. This solid-state imaging element satisfies at least one of the following two conditions.

(A) A product of a carrier concentration and a film thickness of the n-type photoelectric conversion layer is larger than a product of a carrier concentration of the p-type photoelectric conversion layer and a diffusion length of a minority carrier, and a thickness of the depletion region formed in the n-type photoelectric conversion layer is maximized.

(B) A product of the carrier concentration and a film thickness of the p-type photoelectric conversion layer is larger than a product of the carrier concentration of the n-type photoelectric conversion layer and a diffusion length of a minority carrier, and a thickness of the depletion region formed in the p-type photoelectric conversion layer is maximized.

BRIEF DESCRIPTION OF THE DRAWINGS

FIG. 1 is a diagram illustrating a cross-sectional configuration example of a photoelectric conversion element according to a first embodiment of the present disclosure.

FIG. 2 is a diagram illustrating an example of energies of a conduction band and a valence band of each layer of the photoelectric conversion element in FIG. 1.

FIG. 3 is a diagram illustrating an example of I-V characteristics of the photoelectric conversion element in FIG. 1.

FIG. 4 is a diagram illustrating a cross-sectional configuration example of a photoelectric conversion element according to a second embodiment of the present disclosure.

FIG. 5 is a diagram illustrating an example of energies of a conduction band and a valence band of each layer of the photoelectric conversion element in FIG. 4.

FIG. 6 is a diagram illustrating an example of I-V characteristics of the photoelectric conversion element in FIG. 4.

FIG. 7 is a diagram illustrating configurations of Examples 1 to 3 and Comparative Examples 1 to 3.

FIG. 8 is a diagram illustrating measurement results of dark currents in Examples 1 to 3 and Comparative Examples 1 to 3.

FIG. 9 is a diagram illustrating a cross-sectional configuration example of a photoelectric conversion element according to a third embodiment of the present disclosure.

FIG. 10 is a diagram illustrating an example of energies of a conduction band and a valence band of each layer of the photoelectric conversion element in FIG. 9.

FIG. 11 is a diagram illustrating an example of I-V characteristic of the photoelectric conversion element in FIG. 9.

FIG. 12 is a diagram illustrating an example of a schematic configuration of a solid-state imaging element according to a fourth embodiment of the present disclosure.

FIG. 13 is a diagram illustrating an example of a cross-sectional configuration of a pixel in FIG. 12.

FIG. 14 is a diagram illustrating an example of a circuit configuration of the pixel in FIG. 12.

FIG. 15 is a developed view of an example of a configuration of a photoelectric conversion element in FIG. 12.

FIG. 16 is a diagram illustrating an example of a circuit configuration of the pixel in FIG. 12.

FIG. 17 is a diagram illustrating an example of the circuit configuration of the pixel in FIG. 12.

FIG. 18 is a diagram illustrating a modification example of the cross-sectional configuration of the pixel in FIG. 12.

FIG. 19 is a diagram illustrating an example of a schematic configuration of an imaging system.

FIG. 20 is a block diagram depicting an example of schematic configuration of a vehicle control system.

FIG. 21 is a diagram of assistance in explaining an example of installation positions of an outside-vehicle information detecting section and an imaging section.

FIG. 22 is a view depicting an example of a schematic configuration of an endoscopic surgery system.

FIG. 23 is a block diagram depicting an example of a functional configuration of a camera head and a camera control unit (CCU).

MODES FOR CARRYING OUT THE INVENTION

Hereinafter, description is given in detail of embodiments of the present disclosure with reference to the drawings. It is to be noted that the description is given in the following order.

1. First Embodiment (Photoelectric Conversion Element) . . . FIGS. 1 to 3
2. Second Embodiment (Photoelectric Conversion Element) . . . FIGS. 4 to 8
3. Third Embodiment (Photoelectric Conversion Element) . . . FIGS. 9 to 11
4. Fourth Embodiment (Solid-State Imaging Element) . . . FIGS. 12 to 17
5. Modification Example of First Embodiment (Solid-State Imaging Element)
6. Modification Example of Fourth Embodiment (Solid-State Imaging Element) . . . FIG. 18
7. Application Example (Imaging System) . . . FIG. 19
8. Practical Application Examples
   Example of Practical Application to Mobile Body: FIGS. 20 and 21
   Example of Practical Application to Endoscopic Surgery Systems: FIGS. 22 and 23

1. First Embodiment

FIG. 1 illustrates an example of a cross-sectional configuration of a photoelectric conversion element 100 according to a first embodiment of the present disclosure. The photoelectric conversion element 100 is formed on a glass substrate or a semiconductor substrate, for example. As illustrated in FIG. 1, the photoelectric conversion element 100 includes, for example, a lower electrode 101, an n-type buffer layer 102, a p-type photoelectric conversion layer 103, a p-type buffer layer 104, and an upper electrode 105, which are stacked in this order.

The lower electrode 101 is configured by, for example, a transparent electrically-conductive material. Examples of the transparent electrically-conductive material include ITO (Indium Tin Oxide), IZO (Indium Zinc Oxide), and the like.

The n-type buffer layer 102 is a barrier layer that suppresses injection of holes from a side of the lower electrode 101 to the p-type photoelectric conversion layer 103. The n-type buffer layer 102 is, for example, a layer having an n-type electrically-conductive type, and includes, for example, semiconductor nanoparticles having the n-type electrically-conductive type. The semiconductor nanoparticles included in the n-type buffer layer 102 are, for example, a semiconductor substance having a crystalline structure of a size of several nm. The semiconductor nanoparticles included in the n-type buffer layer 102 may be, for example, semiconductor quantum dots having a quantum confinement effect (quantum confinement effect).

The semiconductor nanoparticles included in the n-type buffer layer 102 include, for example, a Group II-VI, Group IV-VI or Group III-V compound semiconductor. The Group II-VI semiconductor nanoparticles included in the n-type buffer layer 102 include, for example, ZnO, ZnS, or ZnSe. The Group IV-VI semiconductor nanoparticles included in the n-type buffer layer 102 include, for example, $TiO_2$. The Group III-V semiconductor nanoparticles included in the n-type buffer layer 102 include, for example, InP, InAs, or InN.

The p-type photoelectric conversion layer 103 absorbs light of a predetermined wavelength range included in light incident from the outside, and converts the absorbed light into signal charge. The p-type photoelectric conversion layer 103 is, for example, a layer having a p-type electrically-conductive type, and is configured by, for example, a deposited layer including semiconductor nanoparticles having the p-type electrically-conductive type. The semiconductor nanoparticles included in the p-type photoelectric conversion layer 103 are, for example, a semiconductor substance having a crystalline structure of a size of several nm. The semiconductor nanoparticles included in the p-type photoelectric conversion layer 103 may be, for example, semiconductor quantum dots having a quantum confinement effect.

The semiconductor nanoparticles included in the p-type photoelectric conversion layer 103 include, for example, a Group I-VI, Group I-III-VI or Group I-V-VI compound semiconductor. The Group I-VI semiconductor nanoparticles included in the p-type photoelectric conversion layer 103 include, for example, $Ag_2Se$ or $Ag_2Te$. The Group I-III-VI semiconductor nanoparticles included in the p-type photoelectric conversion layer 103 include, for example, $CuInSe_2$, $CuInTe_2$, $AgInSe_2$, or $AgInTe_2$. The Group I-V-VI semiconductor nanoparticles included in the p-type photoelectric conversion layer 103 include, for example, $AgBiS_2$, $AgBiSe_2$, or $AgBiTe_2$.

The p-type buffer layer 104 is a barrier layer that suppresses injection of electrons from a side of the upper electrode 105 to the p-type photoelectric conversion layer 103. The p-type buffer layer 104 is, for example, a layer having a p-type electrically-conductive type. The p-type buffer layer 104 includes, for example, semiconductor nanoparticles having the p-type electrically-conductive type. The p-type buffer layer 104 includes, for example, semiconductor nanoparticles (NPs) including an organic matter ($Ag_2Te$-EDT). The semiconductor nanoparticles (NPs) including an organic matter ($Ag_2Te$-EDT) refers to semiconductor nanoparticles (NPs) including $Ag_2Te$ to which ethanedithiol (EDT) is added as a ligand. The semiconductor nanoparticles included in the p-type buffer layer 104 are, for example, a semiconductor substance having a crystalline structure of a size of several nm. The semiconductor nanoparticles included in the p-type buffer layer 104 may be, for example, semiconductor quantum dots having a quantum confinement effect. It is to be noted that the p-type buffer layer 104 may be configured by, for example, a bulk semiconductor. The p-type buffer layer 104 may be configured by, for example, an organic bulk semiconductor (SPIRO-OMeTAD).

The upper electrode 105 is configured by, for example, a light-reflective metal film. Examples of the light-reflective metal film include a gold (Au) film having a thickness of about 100 nm.

In the photoelectric conversion element 100, a p-n junction surface 100A is formed at an interface between the p-type photoelectric conversion layer 103 and the n-type buffer layer 102. Further, in the photoelectric conversion element 100, a product of a carrier concentration and a film thickness of the n-type buffer layer 102 is larger than a product of a carrier concentration of the p-type photoelectric conversion layer 103 and a diffusion length of a minority carrier, and a thickness of a depletion region formed in the p-type photoelectric conversion layer 103 is maximized. At this time, the n-type buffer layer 102 has such a film thickness that the entirety of the p-type photoelectric conversion layer 103 is depleted, and has a thickness of about 200 nm, for example. That is, in the photoelectric conversion element 100, the entirety of the p-type photoelectric conversion layer 103 is depleted; for example, as illustrated in FIG. 1, the entirety of the p-type photoelectric conversion layer 103 and a region of the n-type buffer layer 102 close to the p-n junction surface 100A serve as a depletion region 100B.

Incidentally, the evaluation of the depletion layer (depletion region) can be performed, for example, by EBIC (Electron Beam Induced Current). Specifically, when a cross-section of a device, which is a sample having a p-n junction, is irradiated with an electron beam during observation of SEM (Scanning Electron Microscopy), an electron-hole pair is generated by energy of the electron beam, and the electron-hole pair is separated by an electric field in the depletion layer (depletion region), thus generating the EBIC. Evaluating a distribution of the EBIC in the cross-section of the device enables evaluation of a position of the depletion layer (depletion region) of the device.

FIG. 2 illustrates an example of energies of a conduction band and a valence band of each layer of the photoelectric conversion element 100. FIG. 2 exemplifies energy in a case of using ITO as the lower electrode 101, semiconductor nanoparticles (NPs) including ZnO as the n-type buffer layer 102, and semiconductor nanoparticles (NPs) including $CuInSe_2$ as the p-type photoelectric conversion layer 103. In addition, FIG. 2 exemplifies energy in a case of using an organic semiconductor material (SPIRO-OMeTAD) as the p-type buffer layer 104 and a gold film as the upper electrode 105. It can be appreciated from FIG. 2 that the n-type buffer layer 102 functions as a hole barrier layer and the p-type buffer layer 104 functions as an electron barrier layer. It is to be noted that a material of each layer is not limited to the material illustrated in FIG. 2; even when a material other than the material exemplified in FIG. 2 is used for each layer, the n-type buffer layer 102 functions as the hole barrier layer, and the p-type buffer layer 104 functions as the electron barrier layer.

FIG. 3 illustrates an example of I-V characteristics of the photoelectric conversion element 100. It can be appreciated from FIG. 3 that a dark current I2, which is a noise to a light current I1, is much smaller than the light current I1. It is to be noted that FIG. 3 exemplifies a result obtained when using the material illustrated in FIG. 2; however, even when using a material other than the material exemplified in FIG. 2, a similar result to that in FIG. 3 is obtained.

In the present embodiment, the p-n junction surface 100A is formed at the interface between the p-type photoelectric conversion layer 103 including semiconductor nanoparticles and the n-type buffer layer 102 including semiconductor nanoparticles, and a product of a carrier concentration and a film thickness of the n-type buffer layer 102 is larger than a product of a carrier concentration of the p-type photoelectric conversion layer 103 and a diffusion length of a minority carrier, and a thickness of a depletion region formed in the p-type photoelectric conversion layer 103 is maximized. At this time, the entirety of the p-type photoelectric conversion layer 103 is depleted. This suppresses an increase in a dark current generated due to the use of the semiconductor nanoparticles to a low level. As a result, it is possible to reduce the dark current.

2. Second Embodiment

FIG. 4 illustrates an example of a cross-sectional configuration of a photoelectric conversion element 200 according to a second embodiment of the present disclosure. The photoelectric conversion element 200 is formed on a glass substrate or a semiconductor substrate, for example. As illustrated in FIG. 4, the photoelectric conversion element 200 includes, for example, a lower electrode 201, an n-type buffer layer 202, an n-type photoelectric conversion layer 203, a p-type buffer layer 204, and an upper electrode 205, which are stacked in this order.

The lower electrode 201 is configured by, for example, a transparent electrically-conductive material. Examples of the transparent electrically-conductive material include ITO, IZO, and the like.

The n-type buffer layer 202 is a barrier layer that suppresses injection of holes from a side of the lower electrode 201 to the n-type photoelectric conversion layer 203. The n-type buffer layer 202 is, for example, a layer having an n-type electrically-conductive type, and includes, for example, semiconductor nanoparticles having the n-type electrically-conductive type. The semiconductor nanoparticles included in the n-type buffer layer 202 are configured by ZnO, for example. The semiconductor nanoparticles included in the n-type buffer layer 202 are configured by, for example, a semiconductor substance having a crystalline structure of a size of several nm. The semiconductor nanoparticles included in the n-type buffer layer 202 may be, for example, semiconductor quantum dots having a quantum confinement effect. It is to be noted that the n-type buffer layer 202 may be configured by, for example, a bulk semiconductor. The n-type buffer layer 202 may be configured by, for example, a $TiO_2$ bulk semiconductor. The $TiO_2$ bulk semiconductor can be formed by sputtering, for example.

The n-type photoelectric conversion layer 203 absorbs light of a predetermined wavelength range included in light incident from the outside, and converts the absorbed light into signal charge. The n-type photoelectric conversion layer 203 is, for example, a layer having an n-type electrically-conductive type, and is configured by, for example, a deposited layer including semiconductor nanoparticles having the n-type electrically-conductive type. The semiconductor nanoparticles included in the n-type photoelectric conversion layer 203 are, for example, a semiconductor substance having a crystalline structure of a size of several nm. The semiconductor nanoparticles included in the n-type photoelectric conversion layer 203 may be, for example, semiconductor quantum dots having a quantum confinement effect.

The semiconductor nanoparticles included in the n-type photoelectric conversion layer 203 include, for example, a Group III-V compound semiconductor. The Group III-V semiconductor nanoparticles included in the n-type photoelectric conversion layer 203 include, for example, InAs, InSb, or InN.

The p-type buffer layer 204 is a barrier layer that suppresses injection of electrons from a side of the upper electrode 205 to the n-type photoelectric conversion layer 203. The p-type buffer layer 204 is, for example, a layer having a p-type electrically-conductive type. The p-type buffer layer 204 includes, for example, semiconductor nanoparticles having the p-type electrically conductive type. The semiconductor nanoparticles included in the p-type buffer layer 204 are, for example, a semiconductor substance having a crystalline structure of a size of several nm. The semiconductor nanoparticles included in the p-type buffer layer 204 may be, for example, semiconductor quantum dots having a quantum confinement effect.

The semiconductor nanoparticles included in the p-type buffer layer 204 include, for example, a Group I-V, Group I-III-VI, Group I-II-III-VI or Group IV-VI compound semiconductor. The Group I-V semiconductor nanoparticles included in the p-type buffer layer 204 include, for example, $Ag_2S$ or $Ag_2Se$. The Group I-III-VI semiconductor nanoparticles included in the p-type buffer layer 204 include, for example, $AgInS_2$, $AgInSe_2$, $AgInTe_2$, $CuInS_2$, $CuInSe_2$ or $CuInTe_2$. The Group I-II-III-VI semiconductor nanoparticles included in the p-type buffer layer 204 include, for example, ZnCuInS or ZnCuInSe. The Group IV-VI semiconductor nanoparticles included in the p-type buffer layer 204 include, for example, an organic matter (PbS-EDT). The semiconductor nanoparticles included in the p-type buffer layer 204 may be, for example, nanoparticles of a P-type oxide (e.g., MoOx).

The semiconductor nanoparticles included in the p-type buffer layer 204 may include, for example, a Group III-V compound semiconductor. The Group III-V semiconductor nanoparticles having the p-type electrically-conductive type included in the p-type buffer layer 204 include the same material (e.g., InAs, InSb, or InN) as that of the Group III-VI semiconductor nanoparticles included in the n-type photoelectric conversion layer 203. For example, adding Cd, Be, Mg, or C to InAs, InSb, or InN or subjecting Zn to solid phase diffusion enables the electrically-conductive type of InAs, InSb, or InN to be the p-type electrically-conductive type.

The upper electrode 205 is configured by, for example, a light-reflective metal film. Examples of the light-reflective metal film include a gold (Au) film having a thickness of about 100 nm.

In the photoelectric conversion element 200, a p-n junction surface 200A is formed at an interface between the n-type photoelectric conversion layer 203 and the p-type buffer layer 204. Further, in the photoelectric conversion element 200, a product of a carrier concentration and a film thickness of the p-type buffer layer 204 is larger than a product of a carrier concentration of the n-type photoelectric conversion layer 203 and a diffusion length of a minority carrier, and a thickness of a depletion region formed in the n-type photoelectric conversion layer 203 is maximized. At this time, the n-type buffer layer 202 has such a film thickness that the entirety of the n-type photoelectric conversion layer 203 is depleted. That is, in the photoelectric conversion element 200, the entirety of the n-type photoelectric conversion layer 203 is depleted; for example, as illustrated in FIG. 4, the entirety of the n-type photoelectric conversion layer 203 and a region of the p-type buffer layer 204 close to the p-n junction surface 200A serve as a depletion region 200B.

FIG. 5 illustrates an example of energies of a conduction band and a valence band of each layer of the photoelectric conversion element 200. FIG. 5 exemplifies energy in a case of using ITO as the lower electrode 201, semiconductor nanoparticles (NPs) including ZnO as the n-type buffer layer 202, and semiconductor nanoparticles (NPs) including InAs as the n-type photoelectric conversion layer 203. In addition, FIG. 5 exemplifies energy in a case of using semiconductor nanoparticles (NPs) including $CuInS_2$ as the p-type buffer layer 204 and a gold film as the upper electrode 205. It can be appreciated from FIG. 5 that the n-type buffer layer 202 functions as a hole barrier layer and the p-type buffer layer 204 functions as an electron barrier layer. It is to be noted that a material of each layer is not limited to the material illustrated in FIG. 5; even when a material other than the material exemplified in FIG. 5 is used for each layer, the n-type buffer layer 202 functions as the hole barrier layer, and the p-type buffer layer 204 functions as the electron barrier layer.

FIG. 6 illustrates an example of I-V characteristics of the photoelectric conversion element 200. It can be appreciated from FIG. 6 that the dark current I2, which is a noise to the light current I1, is much smaller than the light current I1. It is to be noted that FIG. 6 exemplifies a result obtained when using the material illustrated in FIG. 5; however, even when using a material other than the material exemplified in FIG. 5, a similar result to that in FIG. 6 is obtained.

In the present embodiment, the p-n junction surface 200A is formed at the interface between the n-type photoelectric conversion layer 203 including semiconductor nanoparticles and the p-type buffer layer 204 including semiconductor nanoparticles, and a product of a carrier concentration and a film thickness of the p-type buffer layer 204 is larger than a product of a carrier concentration of the n-type photoelectric conversion layer 203 and a diffusion length of a minority carrier, and a thickness of a depletion region formed in the n-type photoelectric conversion layer 203 is maximized. At this time, the entirety of the n-type photoelectric conversion layer 203 is depleted. This suppresses an increase in a dark current generated due to the use of the semiconductor nanoparticles to a low level. As a result, it is possible to reduce the dark current.

In the present embodiment, in a case where the Group III-V semiconductor nanoparticles having the p-type electrically-conductive type included in the p-type buffer layer 204 include the same material as that of the Group III-VI semiconductor nanoparticles included in n-type photoelectric conversion layer 203, the n-type photoelectric conversion layer 203 and the p-type buffer layer 204 have a homojunction structure, thus causing a discontinuous part (spike) pointed to the junction part not to be formed. As a result, it is difficult for electric charge to remain in the junction part, thus making it possible to suppress deterioration in EQE due to facilitation of recombination. In addition, it is possible to suppress afterimage (response deterioration) caused by release of electric charge remaining in the junction part.

FIG. 7 illustrates a configuration of each of photoelectric conversion elements in a case where semiconductor nanoparticles included in the p-type buffer layer 204 are configured by $CuInSe_2$ (Example 1), PbS-EDT (Example 2), MoOx (Example 3), none (Comparative Example 1), SPIRO-OMeTAD (Comparative Example 2), or P3HT (Comparative Example 3). FIG. 8 illustrates measurement results of dark currents flowing through the photoelectric conversion elements of Examples 1 to 3 and Comparative Examples 1 to 3. As appreciated from FIG. 8, in a case where the semiconductor nanoparticles included in the p-type buffer layer 204 are configured by $CuInSe_2$, PbS-EDT, or MoOx, it is possible to suppress the dark current flowing through the photoelectric conversion element to a lower level than a case where the p-type buffer layer 204 is not provided or a case where the semiconductor nanoparticles included in the p-type buffer layer 204 are configured by SPIRO-OMeTAD or P3HT.

3. Third Embodiment

FIG. 9 illustrates an example of a cross-sectional configuration of a photoelectric conversion element 300 according to a third embodiment of the present disclosure. The photoelectric conversion element 300 is formed on a glass substrate or a semiconductor substrate, for example. As illustrated in FIG. 9, the photoelectric conversion element 300 includes, for example, a lower electrode 301, an n-type buffer layer 302, an n-type photoelectric conversion layer 303, a p-type photoelectric conversion layer 304, a p-type buffer layer 305, and an upper electrode 306, which are stacked in this order.

The lower electrode 301 is configured by, for example, a transparent electrically-conductive material. Examples of the transparent electrically-conductive material include ITO, IZO, and the like.

The n-type buffer layer 302 is a barrier layer that suppresses injection of holes from a side of the lower electrode 301 to the n-type photoelectric conversion layer 303. The n-type buffer layer 302 is, for example, a layer having an n-type electrically-conductive type, and includes, for example, semiconductor nanoparticles having the n-type electrically-conductive type. The semiconductor nanoparticles included in the n-type buffer layer 302 are configured by ZnO, for example. The semiconductor nanoparticles included in the n-type buffer layer 302 are, for example, a semiconductor substance having a crystalline structure of a size of several nm. The semiconductor nanoparticles included in the n-type buffer layer 302 may be, for example, semiconductor quantum dots having a quantum confinement effect. It is to be noted that the n-type buffer layer 302 may be configured by, for example, a bulk semiconductor. The n-type buffer layer 302 may be configured by, for example, a $TiO_2$ bulk semiconductor. The $TiO_2$ bulk semiconductor can be formed by sputtering, for example.

The n-type photoelectric conversion layer 303 absorbs light of a predetermined wavelength range included in light incident from the outside, and converts the absorbed light into signal charge. The n-type photoelectric conversion layer 303 is, for example, a layer having an n-type electrically-conductive type, and is configured by, for example, a deposited layer including semiconductor nanoparticles having the n-type electrically-conductive type. The semiconductor nanoparticles included in the n-type photoelectric conversion layer 303 are, for example, a semiconductor substance having a crystalline structure of a size of several nm. The semiconductor nanoparticles included in the n-type photoelectric conversion layer 303 may be, for example, semiconductor quantum dots having a quantum confinement effect.

The semiconductor nanoparticles included in the n-type photoelectric conversion layer 303 include, for example, a Group III-V or Group IV-VI compound semiconductor. The Group III-V semiconductor nanoparticles included in the n-type photoelectric conversion layer 303 include, for example, InAs, InSb, or InN. The Group IV-VI semiconductor nanoparticles included in the n-type photoelectric conversion layer 303 include, for example, SnSe or SnTe.

The p-type photoelectric conversion layer 304 absorbs light of a predetermined wavelength range included in light incident from the outside, and converts the absorbed light into signal charge. The p-type photoelectric conversion layer 304 is, for example, a layer having a p-type electrically-conductive type. The p-type photoelectric conversion layer 304 includes, for example, semiconductor nanoparticles having the p-type electrically conductive type. The semiconductor nanoparticles included in the p-type photoelectric conversion layer 304 are, for example, a semiconductor substance having a crystalline structure of a size of several nm. The semiconductor nanoparticles included in the p-type photoelectric conversion layer 304 may be, for example, semiconductor quantum dots having a quantum confinement effect.

The semiconductor nanoparticles included in the p-type photoelectric conversion layer 304 include, for example, a Group I-VI or Group I-III-VI compound semiconductor. The Group I-VI semiconductor nanoparticles included in the p-type photoelectric conversion layer 304 include, for example, $Ag_2S$, $Ag_2Se$, or $Ag_2Te$. The Group I-III-VI semiconductor nanoparticles included in the p-type photoelectric conversion layer 304 include, for example, $CuInSe_2$, $CuInTe_2$, $AgInSe_2$, or $AgInTe_2$.

The semiconductor nanoparticles included in the p-type photoelectric conversion layer 304 may include, for example, a Group III-V compound semiconductor having a p-type electrically-conductive type. The Group III-V semiconductor nanoparticles having the p-type electrically-conductive type included in the p-type photoelectric conversion layer 304 include the same material (e.g., InAs, InSb, or InN) as that of the Group III-VI semiconductor nanoparticles included in the n-type photoelectric conversion layer 303. For example, adding Cd, Be, Mg, or C to InAs, InSb, or InN or subjecting Zn to solid phase diffusion enables the electrically-conductive type of InAs, InSb, or InN to be the p-type electrically-conductive type.

The p-type buffer layer 305 is a barrier layer that suppresses injection of electrons from a side of the upper electrode 306 to the p-type photoelectric conversion layer 304. The p-type buffer layer 305 is, for example, a layer having a p-type electrically-conductive type. The p-type buffer layer 305 includes, for example, semiconductor nanoparticles having the p-type electrically-conductive type. The semiconductor nanoparticles included in the p-type buffer layer 305 are, for example, a semiconductor substance having a crystalline structure of a size of several nm. The semiconductor nanoparticles included in the p-type buffer layer 305 may be, for example, semiconductor quantum dots having a quantum confinement effect. It is to be noted that the p-type buffer layer 305 may be configured by, for example, a bulk semiconductor.

The upper electrode 306 is configured by, for example, a light-reflective metal film. Examples of the light-reflective metal film include a gold (Au) film having a thickness of about 100 nm.

In the photoelectric conversion element 300, a p-n junction surface 300A is formed at an interface between the n-type photoelectric conversion layer 303 and the p-type photoelectric conversion layer 304. Further, in the photoelectric conversion element 300, a product of a carrier concentration and a film thickness of the n-type photoelectric conversion layer 303 is larger than a product of a carrier concentration of the p-type photoelectric conversion layer 304 and a diffusion length of a minority carrier, and a thickness of a depletion region formed in the n-type photoelectric conversion layer 203 is maximized. Further, in the photoelectric conversion element 300, a product of the carrier concentration and a film thickness of the p-type photoelectric conversion layer 304 is larger than a product of the carrier concentration of the n-type photoelectric conversion layer 303 and a diffusion length of a minority carrier, and a thickness of a depletion region formed in the p-type photoelectric conversion layer 304 is maximized. At this time, the n-type buffer layer 302 has such a film thickness that the entirety of the n-type photoelectric conversion layer 303 and the p-type photoelectric conversion layer 304 is depleted. That is, in the photoelectric conversion element 300, the entirety of the n-type photoelectric conversion layer 303 and the p-type photoelectric conversion layer 304 is depleted; for example, as illustrated in FIG. 9, the entirety of the n-type photoelectric conversion layer 303 and the p-type photoelectric conversion layer 304 serves as a depletion region 300B.

FIG. 10 illustrates an example of energies of a conduction band and a valence band of each layer of the photoelectric conversion element 300. FIG. 10 exemplifies energy in a case of using ITO as the lower electrode 301, semiconductor nanoparticles (NPs) including ZnO as the n-type buffer layer 302, and semiconductor nanoparticles (NPs) including InAs as the n-type photoelectric conversion layer 303. In addition, FIG. 10 exemplifies energy in a case of using semiconductor nanoparticles (NPs) including $Ag_2Te$ as the p-type photoelectric conversion layer 304, semiconductor nanoparticles (NPs) including an organic matter ($Ag_2Te$-EDT) as the p-type buffer layer 305, and a gold film as the upper electrode 306. It can be appreciated from FIG. 10 that the n-type buffer layer 302 functions as a hole barrier layer and the p-type buffer layer 305 functions as an electron barrier layer. It is to be noted that a material of each layer is not limited to the material illustrated in FIG. 10; even when a material other than the material exemplified in FIG. 10 is used for each layer, the n-type buffer layer 302 functions as the hole barrier layer, and the p-type buffer layer 305 functions as the electron barrier layer.

FIG. 11 illustrates an example of I-V characteristics of the photoelectric conversion element 300. It can be appreciated from FIG. 11 that the dark current I2, which is a noise to the light current I1, is much smaller than the light current I1. It is to be noted that FIG. 11 exemplifies a result obtained when using the material illustrated in FIG. 10; however, even when using a material other than the material exemplified in FIG. 10, a similar result to that in FIG. 11 is obtained.

In the present embodiment, the p-n junction surface 300A is formed at the interface between the n-type photoelectric conversion layer 303 including semiconductor nanoparticles and the p-type photoelectric conversion layer 304 including semiconductor nanoparticles. Further, in the photoelectric conversion element 300, a product of a carrier concentration and a film thickness of the n-type photoelectric conversion layer 303 is larger than a product of a carrier concentration of the p-type photoelectric conversion layer 304 and a diffusion length of a minority carrier, and a thickness of a depletion region formed in the n-type photoelectric conversion layer 203 is maximized. Further, in the photoelectric conversion element 300, a product of the carrier concentration and a film thickness of the p-type photoelectric conversion layer 304 is larger than a product of the carrier concentration of the n-type photoelectric conversion layer 303 and a diffusion length of a minority carrier, and a thickness of a depletion region formed in the p-type photoelectric conversion layer 304 is maximized. At this time, the entirety of the n-type photoelectric conversion layer 303 and the p-type photoelectric conversion layer 304 is depleted. This suppresses an increase in a dark current generated due to the use of the semiconductor nanoparticles to a low level. As a result, it is possible to reduce the dark current. It is to be noted that, even in a case where a part close to the p-type buffer layer 305 is not completely depleted in the p-type photoelectric conversion layer 304, an effect of reducing the dark current is expectable.

In the present embodiment, in a case where the Group III-V semiconductor nanoparticles having the p-type electrically-conductive type included in the p-type photoelectric conversion layer 304 include the same material as that of the Group III-VI semiconductor nanoparticles included in the n-type photoelectric conversion layer 303, the n-type photoelectric conversion layer 303 and the p-type photoelectric conversion layer 304 have a homojunction structure, thus causing a discontinuous part (spike) pointed to the junction part not to be formed. As a result, it is difficult for electric charge to remain in the junction part, thus making it possible to suppress deterioration in EQE due to facilitation of recombination. In addition, it is possible to suppress after-image (response deterioration) caused by release of electric charge remaining in the junction part.

It is to be noted that, in the present embodiment, it is sufficient for the photoelectric conversion element 300 to only satisfy one of the following two conditions:

(A) the product of the carrier concentration and the film thickness of the n-type photoelectric conversion layer 303 is larger than the product of the carrier concentration of the p-type photoelectric conversion layer 304 and the diffusion length of the minority carrier, and the thickness of the depletion region formed in the n-type photoelectric conversion layer 203 is maximized; and (B) in the photoelectric conversion element 300, the product of the carrier concentration and the film thickness of the p-type photoelectric conversion layer 304 is larger than the product of the carrier concentration of the n-type photoelectric conversion layer 303 and the diffusion length of the minority carrier, and the thickness of the depletion region formed in the p-type photoelectric conversion layer 304 is maximized.

Even in such a case, the entirety of one of the n-type photoelectric conversion layer 303 or the p-type photoelectric conversion layer 304 is depleted, and the entirety of one of the n-type photoelectric conversion layer 303 or the p-type photoelectric conversion layer 304 serves as the depletion region 300B. As a result, the effect of reducing the dark current is expectable.

4. Fourth Embodiment

FIG. 12 illustrates an example of a schematic configuration of a solid-state imaging element 1 according to a fourth embodiment of the present disclosure. The solid-state imaging element 1 includes a pixel array section 10A in which a plurality of pixels 11 are arranged in matrix. The pixel array section 10A is formed in a pixel substrate 10. A frame section 10B in which no pixel 11 is present is provided at an outer edge of the pixel substrate 10. The solid-state imaging element 1 includes a logic circuit 20 that processing a pixel signal. The logic circuit 20 includes, for example, a vertical drive circuit 21, a column signal processing circuit 22, a horizontal drive circuit 23, and a system control circuit 24. The logic circuit 20 generates an output voltage on the basis of a pixel signal obtained from each of the pixels 11, and outputs the generated output voltage to the outside.

For example, the vertical drive circuit 21 sequentially selects a plurality of pixels 11 for each predetermined unit pixel row. The "predetermined unit pixel row" refers to a pixel row that enables selection of pixels by the same address. For example, the column signal processing circuit 22 performs correlated double sampling (Correlated Double Sampling: CDS) processing on a pixel signal outputted from each of the pixels 11 of the row selected by the vertical drive circuit 21. For example, the column signal processing circuit 22 performs the CDS processing to thereby extract a signal level of the pixel signal, and holds pixel data corresponding to a received light amount of each of the pixels 11. The column signal processing circuit 22 includes, for example, a column signal processing section for each data output line VSL. The column signal processing section includes, for example, a single-slope A/D converter. The single-slope A/D converter includes, for example, a comparator and a counter circuit. For example, the horizontal drive circuit 23 sequentially outputs pixel data held in the column signal processing circuit 22 to the outside. The system control circuit 24 controls driving of each of blocks (vertical drive circuit 21, column signal processing circuit 22, and horizontal drive circuit 23) in the logic circuit 20, for example.

As illustrated in FIG. 13, the pixel 11 includes, for example, a stacked-type photoelectric conversion element in which three photoelectric conversion elements 110, 120, and 130 having different wavelength selectivites are stacked. That is, the solid-state imaging element 1 includes the above-described stacked-type photoelectric conversion element for each pixel 11. The pixel 11 further includes, for example, an on-chip lens 160 at a location opposed to the above-described stacked-type photoelectric conversion element. That is, the solid-state imaging element 1 includes the on-chip lens 160 for each pixel 11.

The photoelectric conversion element 110 corresponds to the photoelectric conversion elements 100, 200, and 300 according to the respective first to third embodiments. The photoelectric conversion element 110 is formed, for example, in an insulating layer (insulating layers 115 and 116 and a protective layer 117) on a semiconductor substrate 140, and is configured by stacking, for example, an electrode 111, a photoelectric conversion layer 112, and an electrode 113 in this order from a side of the semiconductor substrate 140. The semiconductor substrate 140 is configured by, for example, a silicon substrate. The photoelectric conversion element 110 further includes, for example, an electrode (an accumulation electrode 114) for accumulation of electric charge provided to be adjacent to the electrode 111 in the same layer as that of the electrode 111. The insulating layer 116 is provided between the electrode 111 and the accumulation electrode 114.

The accumulation electrode 114 is an electrode to accumulate, in the photoelectric conversion layer 112, electric charge generated in the photoelectric conversion layer 112. The accumulation electrode 114 is disposed to be opposed to the photoelectric conversion layer 112 with the insulating layer 116 interposed therebetween. The electrode 111 and the accumulation electrode 114 are covered with the insulating layers 115 and 116, and the electrode 111 is in contact with the photoelectric conversion layer 112 via an opening of the insulating layer 116. The electrode 113 is disposed at a position to be opposed to the electrode 111 and the accumulation electrode 114 with the photoelectric conversion layer 112 and the insulating layer 116 interposed therebetween. The electrode 113 is, for example, a solid film formed in contact with surfaces of the photoelectric conversion layer 112 and the insulating layer 116, and is configured by a layer common to the electrode 113 of an adjacent pixel 11.

The photoelectric conversion element 110 includes, for example, the photoelectric conversion layer 112 that absorbs green light (light of a wavelength region within a range of 495 nm or more and 570 nm or less), and has sensitivity to green light. The photoelectric conversion layer 112 is configured by, for example, a deposited layer of semiconductor nanoparticles that absorb green light. The insulating layers 115 and 116 and the protective layer 117 are each configured by, for example, $SiO_2$, SiN, or the like. The electrodes 111 and 113 are each configured by, for example, a transparent electrically-conductive material. Examples of the transparent electrically-conductive material include ITO (Indium Tin Oxide), IZO (Indium Zinc Oxide), and the like.

The photoelectric conversion element 110 is coupled to a wiring line 156 provided at a back surface of the semiconductor substrate 140 via a contact hole 153 or the like provided in the semiconductor substrate 140, for example. The wiring line 156 electrically couples together the electrode 111 of the photoelectric conversion element 110 and a pixel circuit 12 (e.g., a gate electrode 157 of an amplification transistor in the pixel circuit 12) for the photoelectric conversion element 110.

The photoelectric conversion elements 120 and 130 are formed in the semiconductor substrate 140, for example. The photoelectric conversion element 120 includes, as a photoelectric conversion layer, for example, an n-type semiconductor region 141 formed near a front surface of the semiconductor substrate 140. The photoelectric conversion element 120 includes, for example, the n-type semiconductor region 141 that absorbs blue light (light of a wavelength region within a range of 425 nm or more and 495 nm or less), and has sensitivity to blue light. For example, the photoelectric conversion element 120 is coupled to a wiring line provided at the back surface of the semiconductor substrate 140 via a transfer transistor provided in the semiconductor substrate 140. This wiring line electrically couples together the n-type semiconductor region 141 and the pixel circuit 12 for the photoelectric conversion element 120. It is to be noted that FIG. 13 exemplifies a gate electrode 158 of the transfer transistor electrically coupled to the photoelectric conversion element 120.

The photoelectric conversion element 130 includes, as a photoelectric conversion layer, for example, an n-type semiconductor region 142, of the semiconductor substrate 140, formed in a region deeper than the n-type semiconductor region 141. The photoelectric conversion element 130 includes, for example, the n-type semiconductor region 142 that absorbs red light (light of a wavelength region within a range of 620 nm or more and 750 nm or less), and has sensitivity to red light. For example, the photoelectric conversion element 130 is coupled to a wiring line provided at the back surface of the semiconductor substrate 140 via a transfer transistor provided in the semiconductor substrate 140. This wiring line electrically couples together the n-type semiconductor region 142 and the pixel circuit 12 (e.g., a gate electrode 159 of the amplification transistor in the pixel circuit 12) for the photoelectric conversion element 130.

The semiconductor substrate 140 includes a $p^+$ layer 145 between the n-type semiconductor region 141 and the front surface of the semiconductor substrate 140. The $p^+$ layer 145 suppresses generation of a dark current. The semiconductor substrate 140 further includes a $p^+$ layer 143 between the n-type semiconductor region 141 and the n-type semiconductor region 142. The $p^+$ layer 143 further surrounds a portion of a side surface of the n-type semiconductor region 142 (e.g., near the gate electrode 158). The $p^+$ layer 143 separates the n-type semiconductor region 141 and the n-type semiconductor region 142 from each other. The semiconductor substrate 140 includes a $p^+$ layer 144 near the back surface of the semiconductor substrate 140. The $p^+$ layer 144 suppresses generation of a dark current. An insulating film 154 is provided on the back surface of the semiconductor substrate 140, and an $HfO_2$ film 151 and an insulating film 152 are stacked on the front surface of the semiconductor substrate 140. The $HfO_2$ film 151 is a film having negative fixed electric charge; providing such a film makes it possible to suppress the generation of a dark current. On the back surface of the semiconductor substrate 140, for example, there are formed a wiring line that electrically couples together the photoelectric conversion elements 110, 120, and 130 and the pixel circuit 12, and an insulating layer 155 that covers the pixel circuit 12, or the like.

As for the order of disposing the photoelectric conversion elements 110, 120, and 130 in a deposition direction, the order of the photoelectric conversion element 110, the photoelectric conversion element 120, and the photoelectric conversion element 130 in a light incident direction (from a side of the on-chip lens 160) is preferable. One reason for this is that light of a shorter wavelength is efficiently absorbed on a side of an incident surface. Red has the longest wavelength of the three colors; thus, it is preferable to position the photoelectric conversion element 130 at the lowermost layer as viewed from a light incident surface. The stacked structure of these photoelectric conversion elements 110, 120, and 130 configures one stacked-type photoelectric conversion element.

FIG. 14 illustrates an example of circuit configurations of the pixel 11 (specifically, photoelectric conversion element 110) and a vicinity thereof. FIG. 15 illustrates an example of a developed perspective configuration of the photoelectric conversion element 110 illustrated in FIG. 14. FIG. 16 illustrates an example of circuit configurations of the pixel 11 (specifically, photoelectric conversion element 120) and a vicinity thereof. FIG. 17 illustrates an example of circuit configurations of the pixel 11 (specifically, photoelectric conversion element 130) and a vicinity thereof.

As described above, each pixel 11 has a structure in which the photoelectric conversion elements 110, 120, and 130 are stacked, and the plurality of pixels 11 are arranged in matrix in the pixel array section 10A. Accordingly, a plurality of photoelectric conversion elements 110 are arranged in matrix in a layer, of the pixel array section 10A, closer to the light incident surface, and a plurality of photoelectric conversion elements 130 are arranged in matrix in a layer, of the pixel array section 10A, closer to a surface on a side opposite to the light incident surface. Further, a plurality of photoelectric conversion elements 120 are arranged in matrix in a layer, in the pixel array section 10A, between the layer in which the plurality of photoelectric conversion elements 110 are arranged and the layer in which the plurality of photoelectric conversion elements 130 are arranged.

The solid-state imaging element 1 includes a plurality of pixel circuits 12, a plurality of drive wiring lines VOA, and a plurality of data output lines VSL (VSL1, VSL2, and VSL3). The pixel circuit 12 outputs a pixel signal based on electric charge outputted from the pixel 11. The drive wiring line VOA is a wiring line to which a control signal is applied that controls the output of electric charge accumulated in the pixel 11, and extends in a row direction Dr, for example. The data output line VSL (VSL1, VSL2, and VSL3) is a wiring line that outputs a pixel signal outputted from each pixel circuit 12 to the logic circuit 20, and extends in a column direction Dc, for example.

A pixel circuit 12G is coupled to each photoelectric conversion element 110 (specifically, electrode 111). A pixel circuit 12B is coupled to each photoelectric conversion element 120 via a transfer transistor TR2. A pixel circuit 12R is coupled to each photoelectric conversion element 130 via a transfer transistor TR3. Hereinafter, the photoelectric conversion element 110 may be referred to as a photoelectric conversion section 11G, in some cases, for the sake of convenience. In addition, a circuit including the photoelectric conversion element 120 and the transfer transistor TR2 may be referred to as a photoelectric conversion section 11B, in some cases. In addition, a circuit including the photoelectric conversion element 130 and the transfer transistor TR3 may be referred to as a photoelectric conversion section 11R, in some cases.

As illustrated in FIG. 3, the pixel circuit 12G includes, for example, a floating diffusion FD1, a reset transistor RST1, a selection transistor SEL1, and an amplification transistor AMP1. The floating diffusion FD1 temporarily holds electric charge outputted from the photoelectric conversion section 11G. A source of the reset transistor RST1 is coupled to the floating diffusion FD1, and a drain of the reset transistor RST1 is coupled to a power supply line VDD and a drain of the amplification transistor AMP1. A gate of the reset transistor RST1 is coupled to the vertical drive circuit 21 via a control line (unillustrated). A source of the amplification transistor AMP1 is coupled to a drain of the selection transistor SEL1, and a gate of the amplification transistor AMP1 is coupled to the floating diffusion FD1. A source of the selection transistor SEL1 is coupled to the column signal processing circuit 22 via the data output line VSL1, and a gate of the selection transistor SEL1 is coupled to the vertical drive circuit 21 via a control line (unillustrated). The accumulation electrode 114 of the photoelectric conversion section 11G is coupled to the vertical drive circuit 21 via the drive wiring line VOA. The electrode 113 of the photoelectric conversion section 11G is coupled to the vertical drive circuit 21 via a drive wiring line VOU.

As illustrated in FIG. 16, the pixel circuit 12B includes, for example, a floating diffusion FD2, a reset transistor RST2, a selection transistor SEL2, and an amplification transistor AMP2. The floating diffusion FD2 temporarily holds electric charge outputted from the photoelectric conversion section 11B. A source of the reset transistor RST2 is coupled to the floating diffusion FD2, and a drain of the reset transistor RST2 is coupled to the power supply line VDD and a drain of the amplification transistor AMP2. A gate of the reset transistor RST2 is coupled to the vertical drive circuit 21 via a control line (unillustrated). A source of the amplification transistor AMP2 is coupled to a drain of the selection transistor SEL2, and a gate of the amplification transistor AMP2 is coupled to the floating diffusion FD2. A source of the selection transistor SEL2 is coupled to the column signal processing circuit 22 via the data output line VSL2, and a gate of the selection transistor SEL2 is coupled to the vertical drive circuit 21 via a control line (unillustrated).

As illustrated in FIG. 17, the pixel circuit 12R includes, for example, a floating diffusion FD3, a reset transistor RST3, a selection transistor SEL3, and an amplification transistor AMP3. The floating diffusion FD3 temporarily holds electric charge outputted from the photoelectric conversion section 11R. A source of the reset transistor RST3 is coupled to the floating diffusion FD3, and a drain of the reset transistor RST3 is coupled to the power supply line VDD and a drain of the amplification transistor AMP3. A gate of the reset transistor RST3 is coupled to the vertical drive circuit 21 via a control line (unillustrated). A source of the amplification transistor AMP3 is coupled to a drain of the selection transistor SEL3, and a gate of the amplification transistor AMP3 is coupled to the floating diffusion FD3. A source of the selection transistor SEL3 is coupled to the column signal processing circuit 22 via the data output line VSL3, and a gate of the selection transistor SEL3 is coupled to the vertical drive circuit 21 via a control line (unillustrated).

The reset transistor RST1 resets a potential of the floating diffusion FD1 to a predetermined potential. When the reset transistor RST1 is brought into an ON state, a potential of the floating diffusion FD1 is reset to a potential of the power supply line VDD. The selection transistor SEL1 controls an output timing of a pixel signal from the pixel circuit 12. The amplification transistor AMP1 generates, as the pixel signal, a signal of a voltage corresponding to a level of electric charge held in the floating diffusion FD1. The amplification transistor AMP1 constitutes a source-follower type amplifier, and outputs a pixel signal of a voltage corresponding to a level of electric charge generated in the photoelectric conversion section 11G. When the selection transistor SEL1 is brought into an ON state, the amplification transistor AMP1 amplifies a potential of the floating diffusion FD1, and outputs a voltage corresponding to the potential to the column signal processing circuit 22 via the data output line VSL1. The reset transistor RST1, the amplification transistor AMP1, and the selection transistor SEL1 are each an NMOS transistor, for example.

When the transfer transistor TR2 is brought into an ON state, the transfer transistor TR2 transfers electric charge of the photoelectric conversion section 11B to the floating diffusion FD2. The reset transistor RST2 resets a potential of the floating diffusion FD2 to a predetermined potential. When the reset transistor RST2 is brought into an ON state, a potential of the floating diffusion FD2 is reset to a potential of the power supply line VDD. The selection transistor SEL2 controls an output timing of a pixel signal from the pixel circuit 12. The amplification transistor AMP2 generates, as the pixel signal, a signal of a voltage corresponding to a level of electric charge held in the floating diffusion FD2. The amplification transistor AMP2 constitutes a source-follower type amplifier, and outputs a pixel signal of a voltage corresponding to a level of electric charge generated in the photoelectric conversion section 11B. When the selection transistor SEL2 is brought into an ON state, the amplification transistor AMP2 amplifies a potential of the floating diffusion FD2, and outputs a voltage corresponding to the potential to the column signal processing circuit 22 via the data output line VSL2. The transfer transistor TR2, the reset transistor RST2, the amplification transistor AMP2, and the selection transistor SEL2 are each an NMOS transistor, for example.

When the transfer transistor TR3 is brought into an ON state, the transfer transistor TR3 transfers electric charge of the photoelectric conversion section 11R to the floating diffusion FD3. The reset transistor RST3 resets a potential of the floating diffusion FD3 to a predetermined potential. When the reset transistor RST3 is brought into an ON state, a potential of the floating diffusion FD3 is reset to a potential of the power supply line VDD. The selection transistor SEL3 controls an output timing of a pixel signal from the pixel circuit 12. The amplification transistor AMP3 generates, as the pixel signal, a signal of a voltage corresponding to a level of electric charge held in the floating diffusion FD3. The amplification transistor AMP3 constitutes a source-follower type amplifier, and outputs a pixel signal of a voltage corresponding to a level of electric charge generated in the photoelectric conversion section 11R. When the selection transistor SEL3 is brought into an ON state, the amplification transistor AMP3 amplifies a potential of the floating diffusion FD3, and outputs a voltage corresponding to the potential to the column signal processing circuit 22 via the data output line VSL3. The transfer transistor TR3, the reset transistor RST3, the amplification transistor AMP3, and the selection transistor SEL3 are each an NMOS transistor, for example.

The plurality of pixel circuits 12 is formed on the back surface of the semiconductor substrate 140, for example. The plurality of pixel circuits 12 provided in the solid-state imaging element 1 includes a plurality of pixel circuits 12G each allocated to the photoelectric conversion section 11G, a plurality of pixel circuits 12B each allocated to the photoelectric conversion section 11B, and a plurality of pixel circuits 12R each allocated to the photoelectric conversion section 11R. The pixel circuit 12G outputs a pixel signal based on electric charge outputted from the photoelectric conversion section 11G having a predetermined wavelength selectivity. The pixel circuit 12B outputs a pixel signal based on electric charge outputted from the photoelectric conversion section 11B having a predetermined wavelength selectivity. The pixel circuit 12R outputs a pixel signal based on electric charge outputted from the photoelectric conversion section 11R having a predetermined wavelength selectivity.

In the present embodiment, the photoelectric conversion elements 100, 200, and 300 according to the foregoing first to third embodiments are used. This reduces the dark current which is a noise, thus making it possible to improve the quality of a captured image.

5. Modification Example of First Embodiment

In the first embodiment, the solid-state imaging element 1 is configured by a Pb-free material. However, in the first embodiment, the p-type photoelectric conversion layer 103 may be configured by $PbS\text{-}PbI_x$ semiconductor nanoparticles having a p-type electrically-conductive type. Also in such a case, the entirety of the p-type photoelectric conversion layer 103 is depleted. This suppresses an increase in the dark current generated due to the use of semiconductor nanoparticles to a low level. As a result, it is possible to reduce the dark current.

6. Modification Example of Fourth Embodiment

FIG. 18 illustrates a modification example of a schematic configuration of the solid-state imaging element 1 according to a fourth embodiment. In the fourth embodiment, the solid-state imaging element 1 is provided with the accumulation electrode 114. However, in the solid-state imaging element 1 according to the fourth embodiment, for example, the accumulation electrode 114 may be omitted, as illustrated in FIG. 18. Also in such a case, in the same manner as the fourth embodiment, the use of the photoelectric conversion elements 100, 200, and 300 according to the foregoing first to third embodiments achieves the effect of reducing the dark current, thus making it possible to improve the quality of a captured image.

7. Application Example

FIG. 19 illustrates an example of a schematic configuration of an imaging system 2 including the solid-state imaging element 1 according to the foregoing third embodiment. The imaging system 2 includes, for example, an optical system 220, a shutter device 230, the solid-state imaging element 1, a signal processing circuit 240, and a display unit 250.

The optical system 220 uses image light (incident light) from a subject to form an image on an imaging plane of the solid-state imaging element 1. The shutter device 230 is disposed between the optical system 220 and the solid-state imaging element 1, and controls periods of light irradiation and light blocking with respect to the solid-state imaging element 1. The solid-state imaging element 1 receives the image light (incident light) incident from the solid-state imaging element 1, and outputs a pixel signal corresponding to the received image light (incident light) to the signal processing circuit 240. The signal processing circuit 240 processes an image signal inputted from the solid-state imaging element 1 to generate picture data. The signal processing circuit 240 further generates a picture signal corresponding to the generated picture data to output the generated picture signal to the display unit 250. The display unit 250 displays a picture based on the picture signal inputted from the signal processing circuit 240.

In the present application example, the solid-state imaging element 1 is applied to the imaging system 2. This makes it possible to provide the imaging system 2 with high quality of a captured image.

8. Practical Application Examples

Practical Application Example 1

The technology (the present technology) according to the present disclosure is applicable to a variety of products. For example, the technology according to the present disclosure may be achieved as a device mounted on any type of mobile body such as an automobile, an electric vehicle, a hybrid electric vehicle, a motorcycle, a bicycle, a personal mobility, an aircraft, a drone, a vessel, or a robot.

FIG. 20 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 20, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 20, an audio speaker 12061, a display section 12062, and an instrument panel 12063 are illustrated as the output device. The display section 12062 may, for example, include at least one of an on-board display and a head-up display.

FIG. 21 is a diagram depicting an example of the installation position of the imaging section 12031.

In FIG. 21, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 21 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The description has been given hereinabove of one example of the mobile body control system, to which the technology according to an embodiment of the present disclosure may be applied. The technology according to an embodiment of the present disclosure may be applied to the imaging section 12031 among components of the configuration described above. Specifically, the imaging device 3 is applicable to the imaging section 12031. The application of the technology according to an embodiment of the present disclosure to the imaging section 12031 allows for a high-quality captured image, thus making it possible to perform highly accurate control utilizing the captured image in the mobile body control system.

Practical Application Example 2

FIG. 22 is a view depicting an example of a schematic configuration of an endoscopic surgery system to which the technology according to an embodiment of the present disclosure (present technology) can be applied.

In FIG. 22, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 23 is a block diagram depicting an example of a functional configuration of the camera head 11102 and the CCU 11201 depicted in FIG. 22.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

The description has been given above of one example of the endoscopic surgery system, to which the technology according to an embodiment of the present disclosure is applicable. The technology according to an embodiment of the present disclosure is applicable to the image pickup unit 11402, provided in the camera head 11102 of the endoscope 11100, of the configurations described above. Applying the technology according to an embodiment of the present disclosure to the image pickup unit 11402 makes it possible to obtain a high-quality captured image, and thus to provide the high-quality endoscope 11100.

Description has been given hereinabove referring to the embodiments and modification examples thereof, the application example, and the practical application examples; however, the present disclosure is not limited to the embodiments and the like, and may be modified in a wide variety of ways. It is to be noted that the effects described herein are merely exemplary. The effects of the present disclosure are not limited to those described herein. The present disclosure may also have effects other than those described herein.

In addition, the present disclosure may also have the following configurations.

(1)

A solid-state imaging element including:

a photoelectric conversion layer including first semiconductor nanoparticles; and a buffer layer including second semiconductor nanoparticles, in which a p-n junction surface is formed at an interface between the photoelectric conversion layer and the buffer layer, a product of a carrier concentration and a film thickness of the buffer layer is larger than a product of a carrier concentration of the photoelectric conversion layer and a diffusion length of a minority carrier, and a thickness of a depletion region formed in the photoelectric conversion layer is maximized.

(2)

The solid-state imaging element according to (1), in which an entirety of the photoelectric conversion layer is depleted.

(3)

The solid-state imaging element according to (1), in which the photoelectric conversion layer includes a layer having a p-type electrically-conductive type, the buffer layer includes a layer having an n-type electrically-conductive type, the first semiconductor nanoparticles include a Group I-VI, Group I-III-VI, or Group I-V-VI compound semiconductor, and the second semiconductor nanoparticles include a Group II-VI, Group IV-VI, or Group III-V compound semiconductor.

(4)

The solid-state imaging element according to (3), in which the first semiconductor nanoparticles include $Ag_2Se$ or $Ag_2Te$.

(5)

The solid-state imaging element according to (3), in which the first semiconductor nanoparticles include $CuInSe_2$, $CuInTe_2$, $AgInSe_2$, or $AgInTe_2$.

(6)

The solid-state imaging element according to (3), in which the first semiconductor nanoparticles include $AgBiS_2$, $AgBiSe_2$, or $AgBiTe_2$.

(7)

The solid-state imaging element according to any one of (3) to (6), in which the second semiconductor nanoparticles include ZnO, ZnS, or ZnSe.

(8)

The solid-state imaging element according to any one of (3) to (6), in which the second semiconductor nanoparticles include $TiO_2$.

(9)

The solid-state imaging element according to any one of (3) to (6), in which the second semiconductor nanoparticles include InP, InAs, or InN.

(10)

The solid-state imaging element according to (1), in which the photoelectric conversion layer includes a layer having an n-type electrically-conductive type, the buffer layer includes a layer having a p-type electrically-conductive type, the first semiconductor nanoparticles include a Group III-VI compound semiconductor, and the second semiconductor nanoparticles include a Group I-V, Group I-III-VI, Group I-II-III-VI, or Group IV-VI compound semiconductor, a P-type oxide, or a Group III-V compound semiconductor having a p-type electrically-conductive type.

(11)

The solid-state imaging element according to (10), in which the first semiconductor nanoparticles include InAs, InSb, or InN.

(12)

The solid-state imaging element according to (10) or (11), in which the second semiconductor nanoparticles include $Ag_2S$ or $Ag_2Se$.

(13)

The solid-state imaging element according to (10) or (11), in which the second semiconductor nanoparticles include $AgInS_2$, $AgInSe_2$, $AgInTe_2$, $CuInS_2$, $CuInSe_2$, or $CuInTe_2$.

(14)

The solid-state imaging element according to (10) or (11), in which the second semiconductor nanoparticles include ZnCuInS or ZnCuInSe.

(15)

The solid-state imaging element according to (11), in which the second semiconductor nanoparticles include the Group III-V compound semiconductor having the p-type electrically-conductive type, and include a material same as the first semiconductor nanoparticles.

(16)

The solid-state imaging element according to (10), in which the second semiconductor nanoparticles include MoOx.

(17)

The solid-state imaging element according to (10), in which the second semiconductor nanoparticles include PbS.

(18)

The solid-state imaging element according to (1), in which the photoelectric conversion layer includes a layer having a p-type electrically-conductive type, the buffer layer includes a layer having an n-type electrically-conductive type, and the first semiconductor nanoparticles include PbS-$PbI_x$ semiconductor nanoparticles.

(19)

A solid-state imaging element including:

a p-type photoelectric conversion layer including first semiconductor nanoparticles; and an n-type photoelectric conversion layer including second semiconductor nanoparticles, in which a p-n junction surface is formed at an interface between the p-type photoelectric conversion layer and the n-type photoelectric conversion layer, and the solid-state imaging element satisfies at least one of the following two conditions:

(A) a product of a carrier concentration and a film thickness of the n-type photoelectric conversion layer is larger than a product of a carrier concentration of the p-type photoelectric conversion layer and a diffusion length of a minority carrier, and a thickness of a depletion region formed in the n-type photoelectric conversion layer is maximized; and (B) a product of the carrier concentration and a film thickness of the p-type photoelectric conversion layer is larger than a product of the carrier concentration of the n-type photoelectric conversion layer and a diffusion length of a minority carrier, and a thickness of a depletion region formed in the p-type photoelectric conversion layer is maximized.

(20)

The solid-state imaging element according to (19), in which an entirety of the p-type photoelectric conversion layer and the n-type photoelectric conversion layer is depleted.

(21)

The solid-state imaging element according to (19), in which the first semiconductor nanoparticles include a Group I-VI or Group I-III-VI compound semiconductor, or a Group III-V compound semiconductor having a p-type electrically-conductive type, and the second semiconductor nanoparticles include a Group III-V or Group IV-VI compound semiconductor.

(22)

The solid-state imaging element according to (21), in which the first semiconductor nanoparticles include $Ag_2S$, $Ag_2Se$, or $Ag_2Te$.

(23)

The solid-state imaging element according to (21), in which the first semiconductor nanoparticles include $CuInSe_2$, $CuInTe_2$, $AgInSe_2$, or $AgInTe_2$.

(24)

The solid-state imaging element according to any one of (21) to (23), in which the second semiconductor nanoparticles include InAs, InSb, or InN.

(25)

The solid-state imaging element according to any one of (21) to (23), in which the second semiconductor nanoparticles include SnSe or SnTe.

(26)

The solid-state imaging element according to (24), in which the first semiconductor nanoparticles include the Group III-V compound semiconductor having the p-type electrically-conductive type, and includes a material same as the second semiconductor nanoparticles.

In the solid-state imaging element according to a first aspect of the present disclosure, the p-n junction surface is formed at an interface between the photoelectric conversion layer including the first semiconductor nanoparticles and the buffer layer including the second semiconductor nanoparticles. A product of a carrier concentration and a film thickness of the buffer layer is larger than a product of a carrier concentration of the photoelectric conversion layer and a diffusion length of a minority carrier, and a thickness of the depletion region formed in the photoelectric conversion layer is maximized. This suppresses an increase in a dark current generated due to the use of the semiconductor nanoparticles to a low level. As a result, it is possible to reduce the dark current.

In the solid-state imaging element according to a second aspect of the present disclosure, the p-n junction surface is formed at an interface between the p-type photoelectric conversion layer including the first semiconductor nanoparticles and the n-type photoelectric conversion layer including the second semiconductor nanoparticles. In this solid-state imaging element, at least one of the following two conditions is satisfied.

(A) A product of a carrier concentration and a film thickness of the n-type photoelectric conversion layer is larger than a product of a carrier concentration of the p-type photoelectric conversion layer and a diffusion length of a minority carrier, and a thickness of the depletion region formed in the n-type photoelectric conversion layer is maximized.

(B) A product of the carrier concentration and a film thickness of the p-type photoelectric conversion layer is larger than a product of the carrier concentration of the n-type photoelectric conversion layer and a diffusion length of a minority carrier, and a thickness of the depletion region formed in the p-type photoelectric conversion layer is maximized.

This suppresses an increase in a dark current generated due to the use of the semiconductor nanoparticles to a low level. As a result, it is possible to reduce the dark current.

This application claims the benefit of Japanese Priority Patent Application JP2021-079316 filed with the Japan Patent Office on May 7, 2021, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A solid-state imaging element comprising:

a photoelectric conversion layer including first semiconductor nanoparticles; and a buffer layer including second semiconductor nanoparticles, wherein a p-n junction surface is formed at an interface between the photoelectric conversion layer and the buffer layer, a product of a carrier concentration and a film thickness of the buffer layer is larger than a product of a carrier concentration of the photoelectric conversion layer and a diffusion length of a minority carrier, and a depletion region formed in the photoelectric conversion layer.

2. The solid-state imaging element according to claim 1, wherein an entirety of the photoelectric conversion layer is depleted.

3. The solid-state imaging element according to claim 1, wherein the photoelectric conversion layer comprises a layer having a p-type electrically-conductive type, the buffer layer comprises a layer having an n-type electrically-conductive type, the first semiconductor nanoparticles include a Group I-VI, Group I-III-VI, or Group I-V-VI compound semiconductor, and the second semiconductor nanoparticles include a Group II-VI, Group IV-VI, or Group III-V compound semiconductor.

4. The solid-state imaging element according to claim 3, wherein the first semiconductor nanoparticles include $Ag_2Se$ or $Ag_2Te$.

5. The solid-state imaging element according to claim 3, wherein the first semiconductor nanoparticles include $CuInSe_2$, $CuInTe_2$, $AgInSe_2$, or $AgInTe_2$.

6. The solid-state imaging element according to claim 3, wherein the first semiconductor nanoparticles include $AgBiS_2$, $AgBiSe_2$, or $AgBiTe_2$.

7. The solid-state imaging element according to claim 3, wherein the second semiconductor nanoparticles include ZnO, ZnS, or ZnSe.

8. The solid-state imaging element according to claim 3, wherein the second semiconductor nanoparticles include $TiO_2$.

9. The solid-state imaging element according to claim 3, wherein the second semiconductor nanoparticles include InP, InAs, or InN.

10. The solid-state imaging element according to claim 1, wherein the photoelectric conversion layer comprises a layer having an n-type electrically-conductive type, the buffer layer comprises a layer having a p-type electrically-conductive type, the first semiconductor nanoparticles include a Group III-V compound semiconductor, and the second semiconductor nanoparticles include a Group I-V, Group I-III-VI, Group I-II-III-VI, or Group IV-VI compound semiconductor, a P-type oxide, or a Group III-V compound semiconductor having a p-type electrically-conductive type.

11. The solid-state imaging element according to claim 10, wherein the first semiconductor nanoparticles include InAs, InSb, or InN.

12. The solid-state imaging element according to claim 10, wherein the second semiconductor nanoparticles include $Ag_2S$ or $Ag_2Se$.

13. The solid-state imaging element according to claim 10, wherein the second semiconductor nanoparticles include $AgInS_2$, $AgInSe_2$, $AgInTe_2$, $CuInS_2$, $CuInSe_2$, or $CuInTe_2$.

14. The solid-state imaging element according to claim 10, wherein the second semiconductor nanoparticles include ZnCuInS or ZnCuInSe.

15. The solid-state imaging element according to claim 11, wherein the second semiconductor nanoparticles include the Group III-V compound semiconductor having the p-type electrically-conductive type, and include a material same as the first semiconductor nanoparticles.

16. The solid-state imaging element according to claim 10, wherein the second semiconductor nanoparticles include MoOx.

17. The solid-state imaging element according to claim 10, wherein the second semiconductor nanoparticles include PbS.

18. The solid-state imaging element according to claim 1, wherein the photoelectric conversion layer comprises a layer having a p-type electrically-conductive type, the buffer layer comprises a layer having an n-type electrically-conductive type, and the first semiconductor nanoparticles comprise PbS-$PbI_x$ semiconductor nanoparticles.

19. A solid-state imaging element comprising:

a p-type photoelectric conversion layer including first semiconductor nanoparticles; and an n-type photoelectric conversion layer including second semiconductor nanoparticles, wherein a p-n junction surface is formed at an interface between the p-type photoelectric conversion layer and the n-type photoelectric conversion layer, and the solid-state imaging element satisfies at least one of the following two conditions:

(A) a product of a carrier concentration and a film thickness of the n-type photoelectric conversion layer is larger than a product of a carrier concentration of the p-type photoelectric conversion layer and a diffusion length of a minority carrier, and a depletion region formed in the n-type photoelectric conversion layer; and (B) a product of the carrier concentration and a film thickness of the p-type photoelectric conversion layer is larger than a product of the carrier concentration of the n-type photoelectric conversion layer and a diffusion length of a minority carrier, and a depletion region formed in the p-type photoelectric conversion layer.

20. The solid-state imaging element according to claim 19, wherein an entirety of the p-type photoelectric conversion layer and the n-type photoelectric conversion layer is depleted.

21. The solid-state imaging element according to claim 19, wherein the first semiconductor nanoparticles include a Group I-VI or Group I-III-VI compound semiconductor, or a Group III-V compound semiconductor having a p-type electrically-conductive type, and the second semiconductor nanoparticles include a Group III-V or Group IV-VI compound semiconductor.

22. The solid-state imaging element according to claim 21, wherein the first semiconductor nanoparticles include $Ag_2S$, $Ag_2Se$, or $Ag_2Te$.

23. The solid-state imaging element according to claim 21, wherein the first semiconductor nanoparticles include $CuInSe_2$, $CuInTe_2$, $AgInSe_2$, or $AgInTe_2$.

24. The solid-state imaging element according to claim 21, wherein the second semiconductor nanoparticles include InAs, InSb, or InN.

25. The solid-state imaging element according to claim 21, wherein the second semiconductor nanoparticles include SnSe or SnTe.

26. The solid-state imaging element according to claim 24, wherein the first semiconductor nanoparticles include the Group III-V compound semiconductor having the p-type electrically-conductive type, and includes a material same as the second semiconductor nanoparticles.

* * * * *